US012777937B2

(12) United States Patent
Kang

(10) Patent No.: US 12,777,937 B2
(45) Date of Patent: Oct. 27, 2026

(54) SEMICONDUCTOR PACKAGES

(71) Applicant: Samsung Electronics Co., Ltd., Suwon-si (KR)

(72) Inventor: Tae-Ho Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 573 days.

(21) Appl. No.: 18/360,056

(22) Filed: Jul. 27, 2023

(65) Prior Publication Data

US 2024/0055373 A1 Feb. 15, 2024

(30) Foreign Application Priority Data

Aug. 11, 2022 (KR) ........................ 10-2022-0100294

(51) Int. Cl.
*H10B 80/00* (2026.01)
*H10W 20/20* (2026.01)
(Continued)

(52) U.S. Cl.
CPC .......... *H10W 42/121* (2026.01); *H10B 80/00* (2023.02); *H10W 20/20* (2026.01); *H10W 70/611* (2026.01); *H10W 90/00* (2026.01); *H10W 90/401* (2026.01); *H10W 74/15* (2026.01); *H10W 90/722* (2026.01);
(Continued)

(58) Field of Classification Search
CPC . H01L 23/562; H01L 23/481; H01L 23/5385; H01L 24/16; H01L 25/0652; H01L 24/32; H01L 24/73; H01L 2224/16145; H01L 2224/16225; H01L 2224/32145; H01L 2224/32225; H01L 2224/73204; H10B 80/00; H10W 42/121; H10W 20/20; H10W 70/611; H10W 90/00; H10W 90/401; H10W 74/15;
(Continued)

(56) References Cited

U.S. PATENT DOCUMENTS 7,781,851 B2 8/2010 Seo
9,040,419 B2 5/2015 Son
(Continued)

FOREIGN PATENT DOCUMENTS

KR 10-2019-0107985 A 9/2019
KR 10-2021-0155696 A 12/2021
KR 10-2022-0042028 A 4/2022

*Primary Examiner* — Benjamin Tzu-Hung Liu
(74) *Attorney, Agent, or Firm* — Wolf, Greenfield & Sacks, P.C.

(57) ABSTRACT

Provided is a semiconductor package. The semiconductor package may comprise a first die, a second die on the first die, and connection terminals, the first die comprises: a first silicon substrate that has a lower side and an upper side opposite to the lower side, first through vias, first chip pads, and a first dummy pattern on the upper side of the first silicon substrate, the first dummy pattern having a grid shape from a plan view and at least partially surrounding each of the first chip pads, the second die comprises: a second silicon substrate that has a lower side and an upper side opposite to the lower side, and second through vias, wherein the connection terminals and the first chip pads are in contact with each other and are electrically connected, respectively, and wherein the first dummy pattern includes a metal film or a polymer film.

18 Claims, 22 Drawing Sheets

(51) Int. Cl.
*H10W 42/00* (2026.01)
*H10W 70/60* (2026.01)
*H10W 74/15* (2026.01)
*H10W 90/00* (2026.01)

(52) U.S. Cl.
CPC ........ *H10W 90/724* (2026.01); *H10W 90/732* (2026.01); *H10W 90/734* (2026.01)

(58) Field of Classification Search
CPC ............. H10W 90/722; H10W 90/724; H10W 90/732; H10W 90/734
See application file for complete search history.

(56) References Cited

U.S. PATENT DOCUMENTS

| | | | | |
|---|---|---|---|---|
| 9,263,380 | B2 | 2/2016 | Tsai et al. | |
| 9,553,058 | B1 * | 1/2017 | England | H10W 72/019 |
| 10,930,613 | B2 | 2/2021 | Park et al. | |
| 11,251,144 | B2 | 2/2022 | Jin et al. | |
| 2010/0144091 | A1 | 6/2010 | Kawano et al. | |
| 2018/0033779 | A1 * | 2/2018 | Park | H10D 62/117 |
| 2020/0066666 | A1 * | 2/2020 | Jin | H10W 20/20 |
| 2021/0391269 | A1 | 12/2021 | Park et al. | |

* cited by examiner

SEMICONDUCTOR PACKAGES

CROSS-REFERENCE TO RELATED APPLICATION

This application claims priority to Korean Patent Application No. 10-2022-0100294 filed on Aug. 11, 2022 in the Korean Intellectual Property Office, and all the benefits accruing therefrom under 35 U.S.C. 119, the contents of which in its entirety are herein incorporated by reference.

BACKGROUND

1. Field of the Disclosure

The present disclosure relates to semiconductor packages. More specifically, the present disclosure relates to semiconductor packages in which a dummy pattern is formed on a rear side of the die to improve warpage of the die.

2. Description of the Related Art

An interposer market is growing due to high specification and adoption of a high bandwidth memory (HBM). For example, a semiconductor package that uses a silicon-based interposer may be fabricated by surface-mounting a semiconductor chip on the silicon-based interposer and molding the mounted semiconductor chip with a molding material.

On the other hand, recently, the number of high bandwidth memories has increased due to the high specification, and the size of the semiconductor package has increased, while the size of the high bandwidth memories has decreased. As the size of high bandwidth memories decreases, problems may arise such as increased stress due to a difference in coefficient of thermal expansion (CTE), increased process difficulty of the semiconductor package, and degraded yield.

SUMMARY

Aspects of the present disclosure provide semiconductor packages capable of improving product reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to aspects of the present disclosure, there is provided a semiconductor package comprising, a first die, a second die on the first die, and a plurality of connection terminals that are between the first die and the second die and are configured to electrically connect the first die to the second die, wherein the first die comprises: a first silicon substrate that has a lower side and an upper side opposite to the lower side, a plurality of first through vias that extend in the first silicon substrate and are electrically connected to the plurality of connection terminals, respectively, a plurality of first chip pads that are on the upper side of the first silicon substrate and are electrically connected to the first through vias, respectively, and a first dummy pattern on the upper side of the first silicon substrate, the first dummy pattern having a grid shape from a plan view and at least partially surrounding each of the plurality of first chip pads, wherein the second die comprises: a second silicon substrate that has a lower side and an upper side opposite to the lower side, the lower side of the second silicon substrate facing the upper side of the first silicon substrate, and a plurality of second through vias that extend in the second silicon substrate, wherein the plurality of connection terminals and the plurality of first chip pads are in contact with each other and are electrically connected, respectively, and wherein the first dummy pattern includes a metal film or a polymer film.

According to other aspects of the present disclosure, there is provided a semiconductor package comprising, a package substrate, an interposer structure on the package substrate, and first and second semiconductor chips on the interposer structure and spaced apart from each other in a first direction, wherein the second semiconductor chip includes a plurality of dies stacked in a second direction intersecting the first direction, and a plurality of connection terminals that are configured to electrically connect the plurality of dies to each other, wherein each of the plurality of dies comprises: a silicon substrate that has a lower side and an upper side opposite to the lower side, the lower side of the silicon substrate facing the interposer structure, a plurality of through vias that extend in the silicon substrate and are electrically connected to the plurality of connection terminals, respectively, a plurality of chip pads that are on the upper side of the silicon substrate and are electrically connected to the through vias, respectively, and an insulating film that extends along the upper side of the silicon substrate, and wherein at least one of the plurality of dies includes a dummy pattern on the insulating film, the dummy pattern having a grid shape from a plan view and at least partially surrounding each of the plurality of chip pads of the at least one of the plurality of dies.

According to other aspects of the present disclosure, there is provided a semiconductor package comprising, a package substrate, an interposer structure on the package substrate, and a logic chip and a memory chip on the interposer structure and spaced apart from each other in a first direction, wherein the memory chip includes first and second dies stacked in a second direction intersecting the first direction, and a plurality of connection terminals that are configured to electrically connect the first die to the second die, wherein the first die comprises: a first silicon substrate that has a lower side and an upper side opposite to the lower side, the lower side of the first silicon substrate facing the interposer structure, a plurality of first through vias that extend in the first silicon substrate, a plurality of first chip pads that are on the upper side of the first silicon substrate and are electrically connected to the first through vias, respectively, a first insulating film that extends along the upper side of the first silicon substrate, and a first dummy pattern on the first insulating film, the first dummy pattern having a grid shape from a plan view and at least partially surrounding each of the plurality of first chip pads, wherein the second die comprises: a second silicon substrate that has a lower side and an upper side opposite to the lower side, the lower side of the second silicon substrate facing the upper side of the first silicon substrate, a plurality of second through vias that extend in the second silicon substrate, a plurality of second chip pads that are on the upper side of the second silicon substrate and are electrically connected to the second through vias, respectively, a second insulating film that extends along the upper side of the second silicon substrate, and a second dummy pattern on the second insulating film, the second dummy pattern having a grid shape from the plan view and at least partially surrounding each of the plurality of second chip pads, wherein the plurality of connection terminals are in contact with the plurality of first chip pads, respectively, and wherein each of the first and second dummy patterns includes a metal film or a polymer film.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

A semiconductor package according to example embodiments will be described below with reference to FIGS. 1 to 5. In FIGS. 1 to 5, the semiconductor package according to some embodiments may be a 2.5D package. However, this is merely an example, and the technical idea of the present disclosure is not limited thereto.

Figure 1:
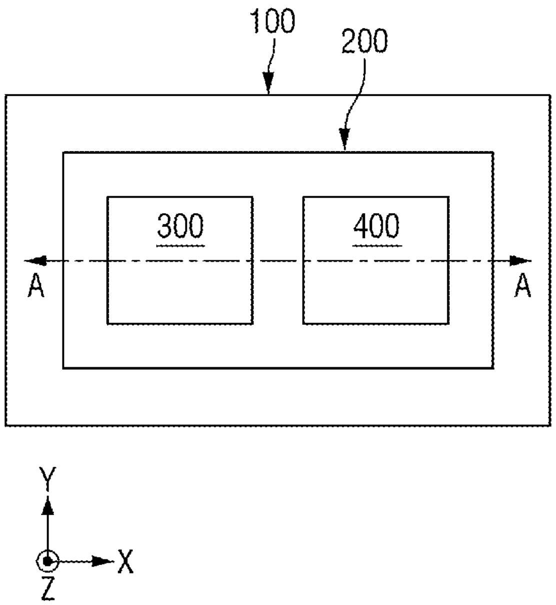
FIG. 1 is an example plan view for explaining the semiconductor package according to some embodiments.
Figure 2:
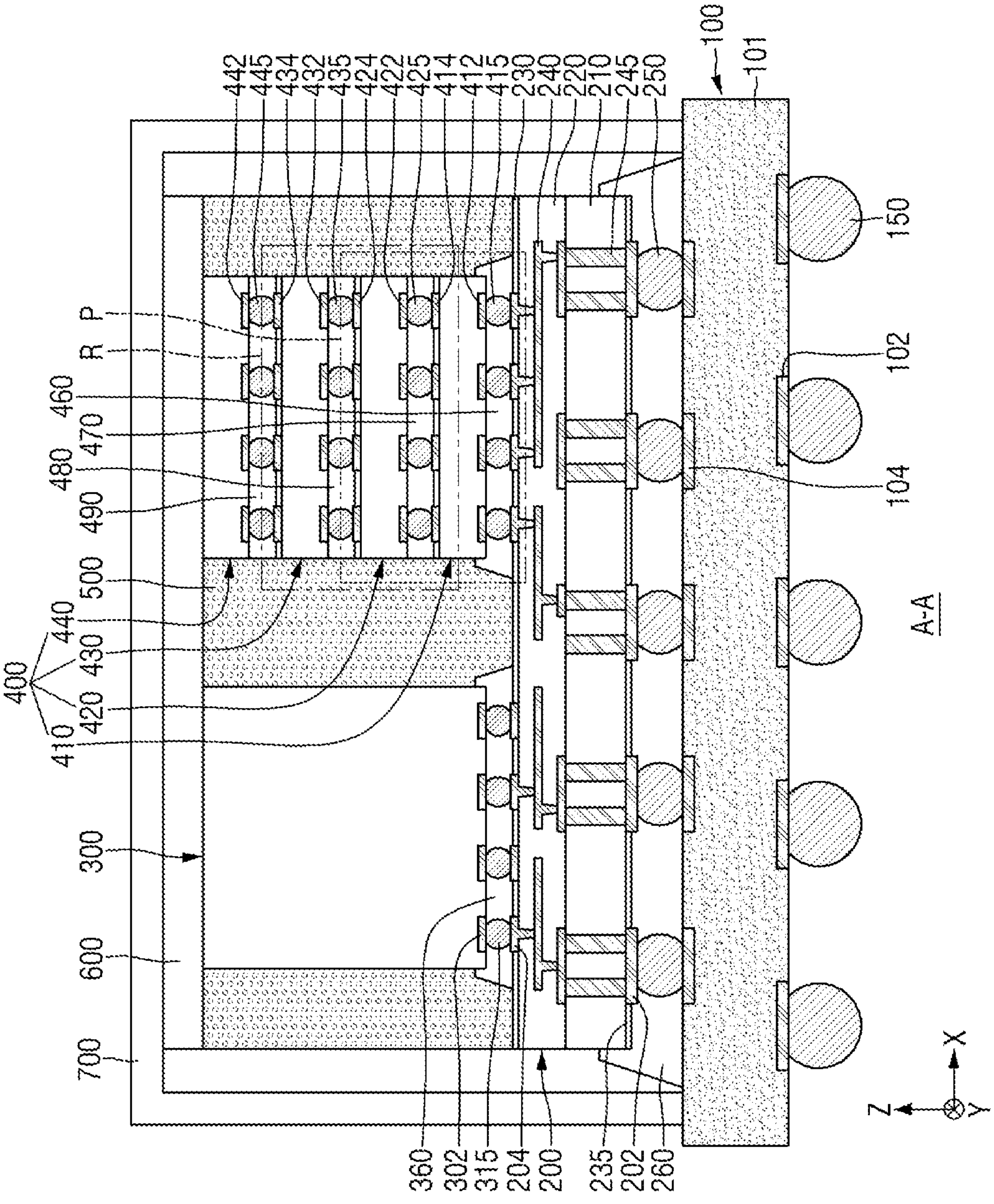
FIG. 2 is an example cross-sectional view taken along line A-A of FIG. 1.

FIG. 1 is an example plan view for explaining the semiconductor package according to some embodiments. FIG. 2 is an example cross-sectional view taken along line A-A of FIG. 1.

Referring to FIGS. 1 and 2, the semiconductor package according to some embodiments may include a package substrate 100, an interposer structure 200, a first semiconductor chip 300, and a second semiconductor chip 400.

The first semiconductor chip 300 and the second semiconductor chip 400 may be spaced apart from each other in a first direction X. Herein, the first direction X, a second direction Y, and a third direction Z may intersect each other. The first direction X, the second direction Y, and the third direction Z may be substantially perpendicular to each other. Also, the first direction X and the second direction Y may be a horizontal direction, and the third direction Z may be a vertical direction. Although FIG. 1 shows that there is a single first semiconductor chip 300 and a single second semiconductor chip 400, the present disclosure is not limited thereto. The semiconductor package according to some embodiments may include one first semiconductor chip 300 and a plurality of second semiconductor chips 400.

The package substrate 100 may be a packaging substrate. The package substrate 100 may be a printed circuit board (PCB). The package substrate 100 may include a lower side and an upper side opposite to the lower side. For example, the lower side and the upper side of the package substrate 100 may be opposite to each other. The upper side of the package substrate 100 may face the interposer structure 200.

The package substrate 100 may include an insulating core 101, a first substrate pad 102, and a second substrate pad 104. As used herein, the first substrate pad 102 may also be referred to as a lower substrate pad 102, and the second substrate pad 104 may also be referred to as an upper substrate pad 104. The first substrate pad 102 and the second substrate pad 104 may be used to electrically connect the interposer structure 100 with other components, respectively. For example, the first substrate pad 102 may be exposed from the lower side of the insulating core 101, and the second substrate pad 104 may be exposed from the upper side of the insulating core 101. The first substrate pad 102 and the second substrate pad 104 may include, but are not limited to, metal materials such as copper (Cu) or aluminum (Al).

Wiring patterns (not shown) for electrically connecting the first substrate pad 102 and the second substrate pad 104 may be formed inside the insulating core 101. Although the insulating core 101 is shown as a single film, this is only for convenience of explanation. For example, the insulating core 101 may be made up of multiple layers, and wiring patterns of multiple layers may be formed therein.

The package substrate 100 may be mounted on a mother board or the like of an electronic device. For example, a first connecting member 150 connected with the first substrate pad 102 may be provided. The package substrate 100 may be mounted on the mother board or the like of the electronic device through the first connecting member 150. The package substrate 100 may be, but is not limited to, a BGA (Ball Grid Array) substrate.

In some embodiments, the package substrate 100 may include a copper clad laminate (CCL). For example, the package substrate 100 may have a structure in which a copper laminate is stacked on a single side or on both sides of a thermoset pre-preg (e.g., C-stage pre-preg).

The interposer structure 200 may be placed on the upper side of the package substrate 100. The interposer structure 200 may include a lower side and an upper side opposite to the lower side. For example, the lower side and the upper side may be opposite to each other. The upper side of the interposer structure 200 may face the first and second semiconductor chips 300 and 400. The lower side of the interposer structure 200 may face the package substrate 100. The interposer structure 200 may facilitate connection between the package substrate 100 and the first and second semiconductor chips 300 and 400 to be described below, and may prevent warpage of the semiconductor package.

The interposer structure 200 may be placed on the package substrate 100. The interposer structure 200 may include an interposer 210, an interlayer insulating layer 220, a first passivation film 230, a second passivation film 235, wiring patterns 240, an interposer via 245, a first interposer pad 202, and a second interposer pad 204.

The interposer 210 may be provided on the package substrate 100. The interposer 210 may be, for example, but is not limited to, a silicon (Si) interposer. The interlayer insulating layer 220 may be placed on the interposer 210. The interlayer insulating layer 220 may include an insulating material. For example, the interlayer insulating layer 220 may include, but is not limited to, at least one of silicon oxide, silicon nitride, silicon oxynitride, and/or a low dielectric constant (low-k) material having a dielectric constant lower than that of silicon oxide.

The first interposer pad 202 and the second interposer pad 204 may each be used to electrically connect the interposer structure 200 with other components. For example, the first interposer pad 202 may be exposed from the lower side of the interposer structure 200, and the second interposer pad 204 may be exposed from the upper side of the interposer structure 200. The first interposer pad 202 and the second interposer pad 204 may include metal materials, for example, but not limited to, copper (Cu) or aluminum (Al). Wiring patterns for electrically connecting the first interposer pad 202 and the second interposer pad 204 may be formed inside the interposer structure 200.

For example, wiring patterns 240 and interposer vias 245 may be formed inside the interposer structure 200. The wiring patterns 240 may be placed inside the interlayer insulating layer 220. The interposer vias 245 may penetrate the interposer 210. Therefore, the wiring patterns 240 and the interposer vias 245 may be connected to each other. The wiring patterns 240 may be electrically connected to the second interposer pad 204. The interposer vias 245 may be electrically connected to the first interposer pads 202. Therefore, the interposer structure 200, the first semiconductor chip 300, and the second semiconductor chip 400 may be electrically connected. The wiring patterns 240 and the interposer vias 245 may each include, but are not limited to, metal materials such as copper (Cu) or aluminum (Al).

The interposer structure 200 may be mounted on the upper side of the package substrate 100. For example, a second connecting member 250 may be formed between the package substrate 100 and the interposer structure 200. The second connecting members 250 may connect the second substrate pads 104 and the first interposer pads 202. Therefore, the package substrate 100 and the interposer structure 200 may be electrically connected to each other.

The second connecting member 250 may be, for example, but is not limited to, solder bumps including low melting point metals, for example, tin (Sn), tin (Sn) alloy, or the like. The second connecting member 250 may have various shapes such as a land, a ball, a pin, and/or a pillar. The second connecting member 250 may be formed of a single layer or multiple layers. When the second connecting member 250 is formed of the single layer, the second connecting member 250 may include, for example, tin-silver (Sn—Ag) solder or copper (Cu). When the second connecting member 250 is formed of the multiple layers, the second connecting member 250 may include, for example copper (Cu) filler and/or solder. Of course, the number, interval, placement form, and the like of the second connecting member 250 are not limited to those shown in the drawings, and may vary depending on the design.

In some embodiments, the size of the first connecting member 150 may be greater than the size of the second connecting member 250. For example, the volume of the first connecting member 150 may be greater than the volume of the second connecting member 250.

A first passivation film 230 may be placed on the interlayer insulating layer 220. The first passivation film 230 may extend along the upper side of the interlayer insulating layer 220. The second interposer pad 204 may penetrate or extend in the first passivation film 230, and may be connected to the wiring pattern 240. A second passivation film 235 may be placed on the interposer 210. The second passivation film 235 may extend along the lower side of the interposer 210. The first interposer pad 202 may penetrate or extend in the second passivation film 235, and may be connected to the interposer via 245.

In some embodiments, the height of the first passivation film 230 in the third direction Z may be smaller than the height of the second interposer pad 204 in the third direction Z. The second interposer pad 204 may protrude or extend in the third direction Z beyond the first passivation film 230. The height of the second passivation film 235 in the third direction Z may be smaller than the height of the first interposer pad 202 in the third direction Z. The first interposer pad 202 may protrude or extend in the third direction Z beyond the second passivation film 235. However, the technical idea of the present disclosure is not limited thereto.

The first passivation film 230 and the second passivation film 235 may each include silicon nitride. In contrast, the first passivation film 230 and the second passivation film 235 may be each made up of a passivation material, a BCB (9 enzoCycloButene), polybenzeneoxazole, polyimide, epoxy, silicon oxide, silicon nitride or a combination thereof.

In some embodiments, a first underfill 260 may be formed between the package substrate 100 and the interposer structure 200. The first underfill 260 may fill or be in a space between the package substrate 100 and the interposer structure 200. Also, the first underfill 260 may cover or be on the second connecting member 250. The first underfill 260 may prevent cracking or the like of the interposer structure 200, by fixing the interposer structure 200 onto the package substrate 100. The first underfill 260 may include, for example, but is not limited to, an insulating polymeric material such as an EMC (epoxy molding compound).

The first semiconductor chip 300 and the second semiconductor chip 400 may be spaced apart from each other in the first direction X and placed on the upper side of the interposer structure 200. The first semiconductor chip 300 and the second semiconductor chip 400 may each be an integrated circuit (IC) in which hundreds to millions of semiconductor elements are integrated in a single chip.

In some embodiments, the first semiconductor chip 300 may be a logic chip. For example, the first semiconductor chip 300 may be, but is not limited to, an application processor (AP), such as a CPU (Central Processing Unit), a GPU (Graphic Processing Unit), an FPGA (Field-Programmable Gate Array), a digital signal processor, an encryption processor, a micro-processor, a micro-controller, and/or an ASIC (Application-Specific IC).

In some embodiments, the second semiconductor chip 400 may be a memory chip. For example, the second semiconductor chip 400 may be a volatile memory such as a DRAM (dynamic random access memory) or a SRAM (static random access memory), or a non-volatile memory such as a flash memory, a PRAM (phase-change random access memory), a MRAM (Magnetoresistive Random Access Memory), a FeRAM (Ferroelectric Random Access Memory) or a RRAM (Resistive Random Access Memory).

As an example, the first semiconductor chip 300 may be an ASIC, such as a GPU, and the second semiconductor chip 400 may be a stack memory, such as a high bandwidth memory (HBM). Such a stack memory may have a form in which a plurality of integrated circuits are stacked. The stacked integrated circuits may be electrically connected to each other through a TSV (Through Silicon Via) or the like. A detailed description of the stack memory will be provided below using FIGS. 3 and 4.

The first semiconductor chip 300 may include first pads 302. The first pads 302 may be used to electrically connect the first semiconductor chip 300 with other components. For example, the first pads 302 may be exposed from the lower side of the first semiconductor chip 300.

The second semiconductor chip 400 may include second pads 412. The second pads 412 may be used to electrically connect the second semiconductor chip 400 with other components. For example, the second pads 412 may be exposed from the lower side of the second semiconductor chip 400.

The first pad 302 and the second pad 412 may each include, but are not limited to, metal materials such as copper (Cu) or aluminum (Al).

The first semiconductor chip 300 and the second semiconductor chip 400 may be mounted on the upper side of the interposer structure 200. For example, a third connecting member 315 may be formed between the interposer structure 200 and the first semiconductor chip 300. The third connecting member 315 may connect some of the plurality of second interposer pads 204 and the first pads 302. Therefore, the interposer structure 200 and the first semiconductor chip 300 may be electrically connected.

Also, for example, a fourth connecting member 415 may be formed between the interposer structure 200 and the second semiconductor chip 400. The fourth connecting member 415 may connect others of the plurality of second interposer pads 204 and the second pad 412. Therefore, the interposer structure 200 and the second semiconductor chip 400 may be electrically connected.

The third connecting member 315 and the fourth connecting member 415 may each be solder bumps including low melting point metals, for example, tin (Sn), tin (Sn) alloy or the like, but are not limited thereto. The third connecting member 315 and the fourth connecting member 415 may each have various shapes such as a land, a ball, a pin, and/or a pillar. Also, the third connecting member 315 and the fourth connecting member 415 may each include a UBM (Under Bump Metallurgy).

The third connecting member 315 and the fourth connecting member 415 may each be formed of a single layer or multiple layers. When the third connecting member 315 and the fourth connecting member 415 are each formed of a single layer, the third connecting member 315 and the fourth connecting member 415 may each include tin-silver (Sn—Ag) solder or copper (Cu), as an example. When the third connecting member 315 and the fourth connecting member 415 are each formed of multiple layers, the third connecting member 315 and the fourth connecting member 415 may each include copper (Cu) fillers and/or solder, as an example. However, the technical idea of the present disclosure is not limited thereto. Of course, the number, interval, placement form, and the like of the third connecting member 315 and the fourth connecting member 415 are not limited to those shown in the drawings, and may vary depending on the design.

In some embodiments, some of the wiring patterns 240 may electrically connect the third connecting member 315 and the fourth connecting member 415. For example, some of the wiring patterns 240 may be connected to the second interposer pad 204 connected to the third connecting member 315, and may be connected to the second interposer pad 204 connected to the fourth connecting member 415. Accordingly, the first semiconductor chip 300 and the second semiconductor chip 400 may be electrically connected.

In some embodiments, a second underfill 360 may be formed between the interposer structure 200 and the first semiconductor chip 300. A third underfill 460 may be formed between the interposer structure 200 and the second semiconductor chip 400. The second underfill 360 may fill a space between the interposer structure 200 and the first semiconductor chip 300. The third underfill 460 may fill a space between the interposer structure 200 and the second semiconductor chip 400. Also, the second underfill 360 may cover or be on the third connecting member 315. The third underfill 460 may cover or be on the fourth connecting member 415.

The second underfill 360 and the third underfill 460 may prevent cracking or the like of the first and second semiconductor chips 300 and 400, by fixing the first and second semiconductor chips 300 and 400 onto the interposer structure 200. The second underfill 360 and the third underfill 460 may each include, but are not limited to, an insulating polymeric material such as an EMC.

A mold layer 500 may be placed on the interposer structure 200. The mold layer 500 may be provided between the first semiconductor chip 300 and the second semiconductor chip 400. The mold layer 500 may separate the first semiconductor chip 300 and the second semiconductor chip 400 from each other.

The mold layer 500 may include, but is not limited to, an insulating polymeric material such as an EMC. The mold layer 500 may include a different material from the first underfill 260, the second underfill 360, and the third underfill 460. For example, the first underfill 260, the second underfill 360, and the third underfill 460 may each include an insulating material that has better fluidity than the mold layer 500. Therefore, the first underfill 260, the second underfill 360 and the third underfill 460 may efficiently fill a narrow gap between the package substrate 100 and the interposer structure 200 or between the interposer structure 200 and the first and second semiconductor chips 300 and 400.

The semiconductor package according to some embodiments may further include a sticking film 600 and a heat slug 700.

The sticking film 600 may be provided on the mold layer 500. The sticking film 600 may be provided on the first semiconductor chip 300 and the second semiconductor chip 400. The sticking film 600 may come into contact with the upper side of the mold layer 500. The sticking film 600 may come into contact with the upper side of the first semiconductor chip 300 and the upper side of the second semiconductor chip 400. The sticking film 600 may adhere and fix the mold layer 500, the first semiconductor chip 300, the second semiconductor chip 400 and the heat slug 700 to each other. The sticking film 600 may include an adhesive material. For example, the sticking film 600 may include a curable polymer. The sticking film 600 may include, for example, an epoxy-based polymer.

The heat slug 700 may be placed on the package substrate 100. The heat slug 700 may cover or be on the first semiconductor chip 300 and the second semiconductor chip 400. The heat slug 700 may include, but is not limited to, a metal material.

The second semiconductor chip 400 will be described in more detail below with reference to FIGS. 3 to 5.

Figure 3:
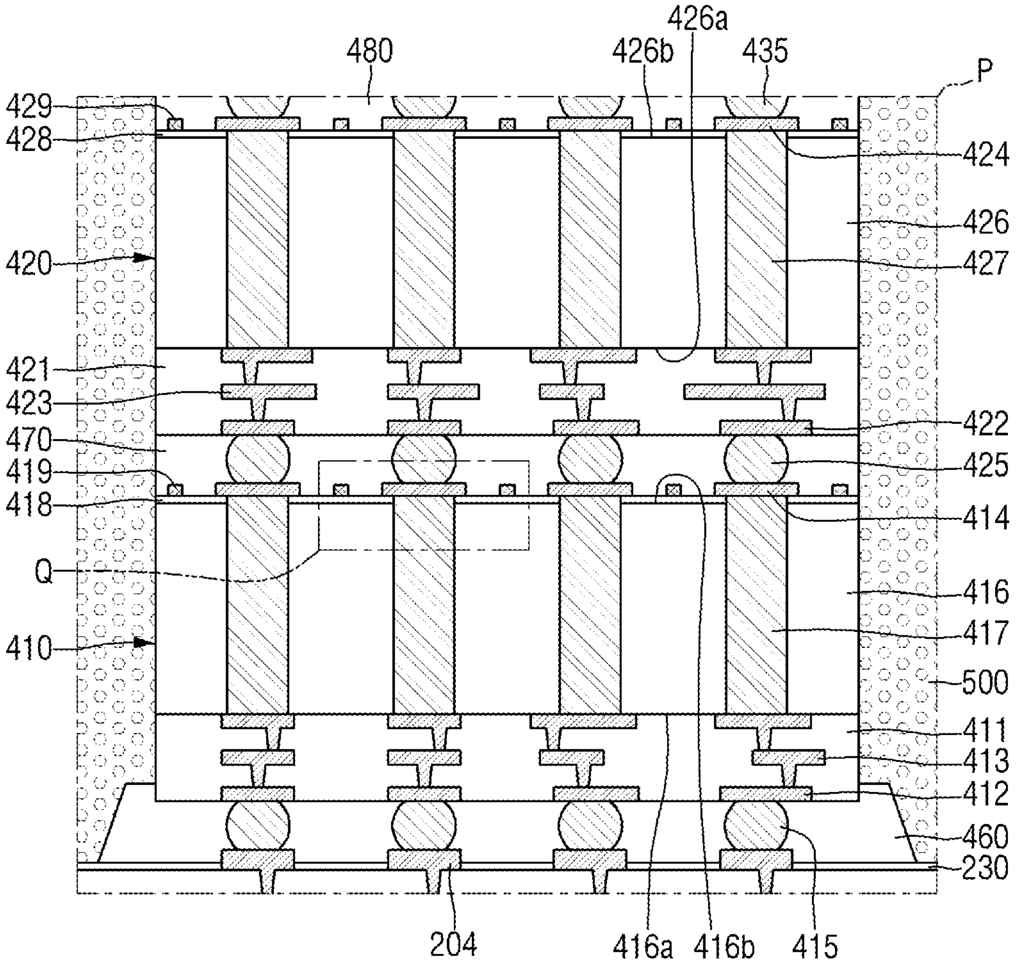
FIG. 3 is an enlarged view of a region P of FIG. 2.

FIG. 3 is an enlarged view of a region P of FIG. 2. FIG. 4 is an enlarged view of a region Q of FIG. 3. FIG. 5 is an example plan view for explaining a chip pad and a dummy pattern according to some embodiments.

Referring to FIGS. 2 and 3, the second semiconductor chip 400 may include a plurality of dies. For example, the second semiconductor chip 400 may include a first die 410, a second die 420, a third die 430 and a fourth die 440. Although the second semiconductor chip 400 is shown to be a stacked memory with four dies stacked in the third direction Z in some embodiments, the idea of the disclosure is not limited thereto. The number of dies included in the second semiconductor chip 400 may vary according to product design.

The first die 410, the second die 420, the third die 430, and the fourth die 440 may be stacked in the third direction Z in sequence or sequentially. That is, the first die 410 may be mounted on the interposer structure 200. The second die 420 may be placed on the first die 410. The third die 430 may be placed on the second die 420. The fourth die 440 may be placed on the third die 430.

The second semiconductor chip 400 according to some embodiments may further include a plurality of connection terminals. The plurality of connection terminals may include, for example, a first connection terminal 425, a second connection terminal 435, and a third connection terminal 445.

The first connection terminal 425 may be placed between the first die 410 and the second die 420. The first connection terminal 425 may electrically connect the first die 410 and the second die 420, between the first die 410 and the second die 420. The second connection terminal 435 may be placed between the second die 420 and the third die 430. The second connection terminal 435 may electrically connect the second die 420 and the third die 430, between the second die 420 and the third die 430. The third connection terminal 445 may be placed between the third die 430 and the fourth die 440. The third connection terminal 445 may electrically connect the third die 430 and the fourth die 440, between the third die 430 and the fourth die 440.

Each of the first to third connection terminals 425, 435, and 445 may be, but are not limited to, a solder bump including a low melting point metal, for example, tin (Sn), tin (Sn) alloy, or the like. Each of the first to third connection terminals 425, 435, and 445 may have various shapes such as a land, a ball, a pin, and/or a pillar. Further, each of the first to third connection terminals 425, 435, and 445 may include a UBM (Under Bump Metallurgy).

Each of the first to third connection terminals 425, 435, and 445 may be formed of a single layer or multiple layers. When the first to third connection terminals 425, 435, and 445 are each formed of a single layer, each of the first to third connection terminals 425, 435, and 445 may include tin-silver (Sn—Ag) solder or copper (Cu) as an example. When the first to third connection terminals 425, 435, and 445 are each formed of multiple layers, each of the first to third connection terminals 425, 435, and 445 may include a copper (Cu) filler and/or a solder as an example. However, the technical idea of the present disclosure is not limited thereto. Of course, the number, interval, placement form, and the like of the first to third connection terminals 425, 435, and 445 are not limited to those shown in the drawings, and may vary depending on the design.

The second semiconductor chip 400 according to some embodiments may include insulating adhesive layers placed between each die. For example, the second semiconductor chip 400 may include a first insulating adhesive layer 470, a second insulating adhesive layer 480, and a third insulating adhesive layer 490.

The first insulating adhesive layer 470 may be placed between the first die 410 and the second die 420. The first insulating adhesive layer 470 may cover or be on the plurality of first connection terminals 425. The second insulating adhesive layer 480 may be placed between the second die 420 and the third die 430. The second insulating adhesive layer 480 may cover or be on the plurality of second connection terminals 435. The third insulating adhesive layer 490 may be placed between the third die 430 and the fourth die 440. The third insulating adhesive layer 490 may cover or be on the plurality of third connection terminals 445.

The first insulating adhesive layer 470, the second insulating adhesive layer 480, and the third insulating adhesive layer 490 may each include a non-conductive film (NCF), a non-conductive paste (NCP), an insulating polymer or epoxy resin. However, the technical idea of the present disclosure is not limited thereto.

In some embodiments, the first die 410 may be a buffer die. The buffer die may also be called an interface die, a base die, a logic die, a master die, and/or the like. The second through fourth dies 420, 430, and 440 may be core dies. The core die may also be called a memory die, a slave die, or the like.

In some embodiments, the first die 410, that is, the buffer die may include a physical layer and a direct access region. The physical layer of the first die 410 may include interface circuits for communicating with an external host device, and may be electrically connected to the first semiconductor chip 300 through the interposer structure 200. The second semiconductor chip 400 may receive signals from the first semiconductor chip 300 or transmit signals to the first semiconductor chip 300 through the physical layer. Signals and/or data received through the physical layer of the first die 410 may be transferred to the second to fourth dies 420, 430, and 440 through the first through third connection terminals 425, 435, and 445. The direct access region may provide an access path that may test the second semiconductor chip 400 without going through the first semiconductor chip 300. The direct access region may include a conductive means that allow direct communication with the external test device. In some embodiments, the second through fourth dies 420, 430, and 440, that is, each of the core dies may include a memory cell array.

In FIG. 3, the first die 410 may include a first interlayer insulating film 411, a first silicon substrate 416, a plurality of first through vias 417, a first insulating film 418, a plurality of first chip pads 414, and a first dummy pattern 419. The second die 420 may include a second interlayer insulating film 421, a second silicon substrate 426, a plurality of second through vias 427, a second insulating film 428, a plurality of second chip pads 424, and a second dummy pattern 429. The configuration of the third die 430 and the fourth die 440 may be substantially the same as the configuration of the second die 420.

The first silicon substrate 416 may include a front side 416*a* and a rear side 416*b* opposite to the front side 416*a*. For example, the front side 416*a* and the rear side 416*b* may be opposite to each other. As used herein, the front side 416*a* of the first silicon substrate 416 may also be referred to as a lower side 416*a*, and the rear side 416*b* of the first silicon substrate 416 may also be referred to as an upper side 416*b*. The front side 416*a* of the first silicon substrate 416 may face the interposer structure 200. The rear side 416*b* of the first silicon substrate 416 may face the second die 420. The first silicon substrate 416 may include silicon (Si).

The first interlayer insulating film 411 may be placed on the front side 416*a* of the first silicon substrate 416. The first interlayer insulating film 411 may be placed between the first silicon substrate 416 and the interposer structure 200. Each of the first interlayer insulating films 411 may be made up of a photoimageable dielectric. For example, the first interlayer insulating film 411 may include a photoimageable polymer. The photoimageable polymer may be formed of, for example, at least one of photoimageable polyimide, polybenzoxazole, phenolic polymer, and/or benzocyclobutene-based polymer. As another example, the first interlayer insulating film 411 may be formed of a silicon oxide film, a silicon nitride film or a silicon oxynitride film.

First metal patterns 413 and second pads 412 may be included inside the first interlayer insulating film 411. The second pads 412 may expose the lower side of the first interlayer insulating film 411. The second pads 412 may be connected with the fourth connecting member 415. The first metal patterns 413 may be connected with the second pad 412. Also, the first metal patterns 413 may be connected to a first through via 417 which will be described later. The first metal patterns 413 may include, for example, but are not limited to, copper (Cu).

A plurality of first through vias 417 may each penetrate or extend in the first silicon substrate 416. The plurality of first through vias 417 may penetrate or extend from the front side 416*a* to the rear side 416*b* of the first silicon substrate 416. At least some of each first through via 417 may protrude or extend from the rear side 416*b* of the first silicon substrate 416. That is, the level of the upper side of each first through via 417 may be different from the level of the rear side 416*b* of the first silicon substrate 416. For example, the plurality of first through vias 417 may each extend above the rear side 416*b* of the first silicon substrate 416 in the third direction Z. The plurality of first through vias 417 may electrically connect the first metal patterns 413 and the first chip pads 414. That is, the first die 410 and the second die 420 may be electrically connected through the plurality of first through vias 417. The plurality of first through vias 417 may each include, but are not limited to, a metal material such as copper (Cu) or aluminum (Al).

The first insulating film 418 may extend along the rear side 416*b* of the first silicon substrate 416. The first insulating film 418 may include an insulating material such as a silicon oxide film or silicon nitride film. The upper side of the first insulating film 418 may be placed on the same plane as (e.g., may be coplanar with) the upper sides of the plurality of first through vias 417.

A plurality of first chip pads 414 may be placed on the rear side 416*b* of the first silicon substrate 416. The plurality of first chip pads 414 may be electrically connected to the plurality of first through vias 417, respectively. Also, the plurality of first chip pads 414 may be electrically connected to the plurality of first connection terminals 425. The plurality of first chip pads 414 may come into contact with the plurality of first connection terminals 425.

Figure 5:
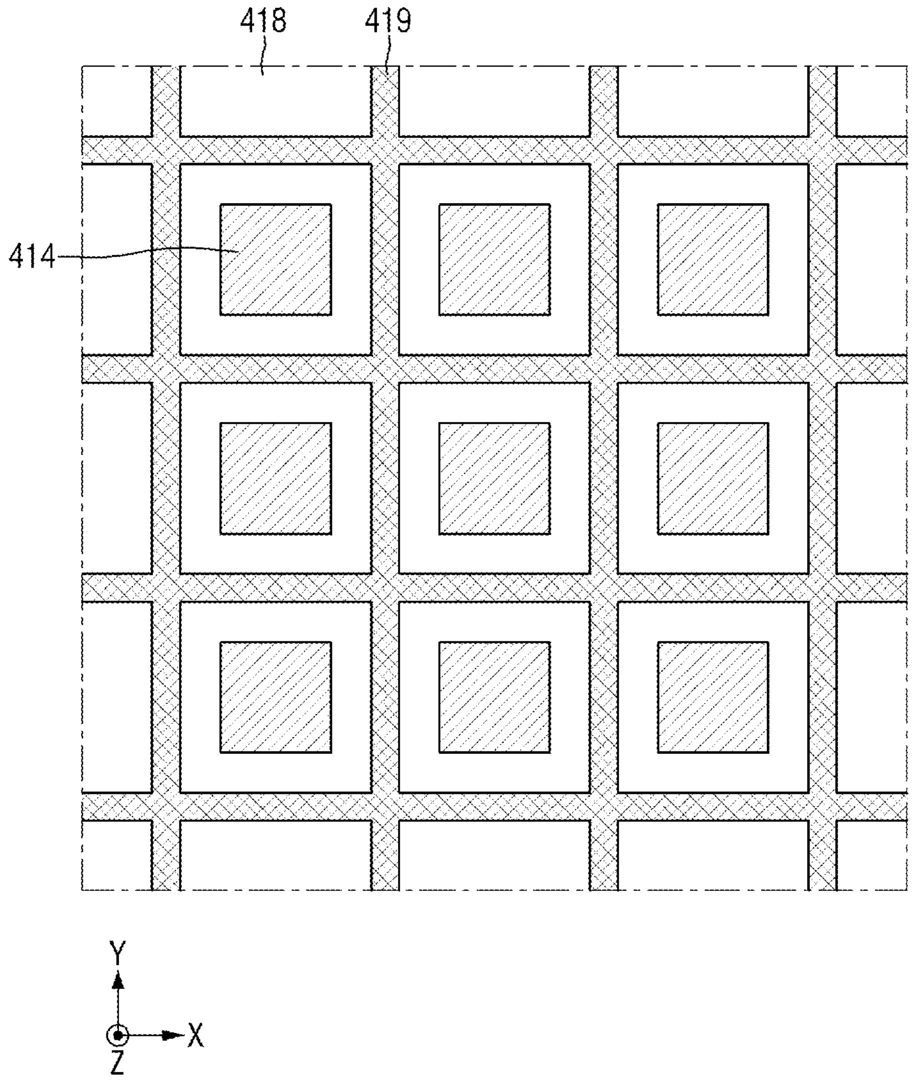
FIG. 5 is an example plan view for explaining a chip pad and a dummy pattern according to some embodiments.

In FIG. 5, the first dummy pattern 419 may have a grid shape from a plan viewpoint. The first dummy pattern 419 may partially or entirely surround each of the plurality of first chip pads 414 from a plan viewpoint. However, the technical idea of the present disclosure is not limited thereto.

In FIG. 3, the first dummy pattern 419 may be placed on the first insulating film 418. The first dummy pattern 419 may be placed between the plurality of first chip pads 414 from a cross-sectional viewpoint. The first dummy pattern 419 may include a metal film or a polymer film. For example, the first dummy pattern 419 may include a metal film such as copper (Cu) or nickel (Ni), or may include a polymer film such as photosensitive polyimide (PSPI).

Since the first die 410 includes the first dummy pattern 419, warpage of the first die 410 may be reduced. A plurality of first metal patterns 413 including a metal material may be formed below the first silicon substrate 416 (e.g., formed on the front side 416*a* of the first silicon substrate 416). On the other hand, in the upper portion of the first silicon substrate 416, a configuration including the metal material may be relatively small. When the first die 410 has the aforementioned structure, warpage of the first die 410 may deepen. The present disclosure may reduce warpage of the first die 410 by placing the first dummy pattern 419 above the first silicon substrate 416 (e.g., by placing the first dummy pattern 419 on the rear side 416*b* of the first silicon substrate 416).

Figure 4:
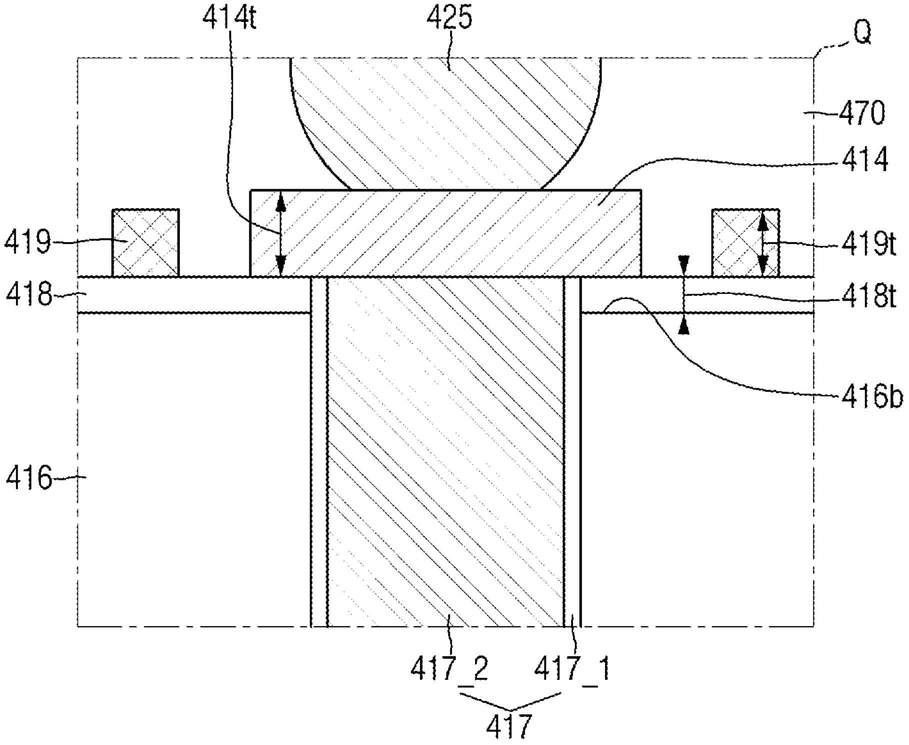
FIG. 4 is an enlarged view of a region Q of FIG. 3.

In FIG. 4, the first dummy pattern 419 may be placed on the first insulating film 418. A lower side of the first dummy pattern 419 may come into contact with the upper side of the first insulating film 418. The first dummy pattern 419 may not overlap the first insulating film 418 in a horizontal direction (first direction X or second direction Y).

In some embodiments, a thickness 418*t* of the first insulating film 418 in the third direction Z may be smaller than a thickness 419*t* of the first dummy pattern 419 in the third direction Z. Also, the thickness 419*t* of the first dummy pattern 419 in the third direction Z may be smaller than a thickness 414*t* of the first chip pad 414 in the third direction Z. However, the technical idea of the present disclosure is not limited thereto.

In some embodiments, each of the plurality of first through vias 417 may include a via insulating film 417_1 and a via filling film 417_2. The via insulating film 417_1 may be made up of an oxide film, a nitride film, a carbide film, a polymer, or a combination thereof. The via filling film 417_2 may include a metal material such as copper (Cu) or aluminum (Al).

In FIG. 3, the second silicon substrate 426 may include a front side 426*a* and a rear side 426*b* opposite to the front side 426*a*. For example, the front side 426*a* and the rear side 426*b* may be opposite to each other. As used herein, the front side 426*a* of the second silicon substrate 426 may also be referred to as a lower side 426*a*, and the rear side 426*b* of the second silicon substrate 426 may also be referred to as an upper side 426*b*. The front side 426*a* of the second silicon substrate 426 may face the first die 410. The front side 426*a* of the second silicon substrate 426 may face the rear side 416*b* of the first silicon substrate 416. The rear side 426*b* of the second silicon substrate 426 may face the third die 430. The second silicon substrate 426 may include silicon (Si).

The second interlayer insulating film 421 may be placed on the front side 426*a* of the second silicon substrate 426. The second interlayer insulating film 421 may be placed between the second silicon substrate 426 and the first silicon substrate 416. Each of the second interlayer insulating films 421 may be made up of a photoimageable dielectric. For example, the second interlayer insulating film 421 may include a photoimageable polymer. The photoimageable polymer may be formed of, for example, at least one of photoimageable polyimide, polybenzoxazole, phenolic polymer, and/or benzocyclobutene-based polymer. As another example, the second interlayer insulating film 421 may be formed of a silicon oxide film, a silicon nitride film or a silicon oxynitride film.

Second metal patterns 422 and 423 may be included inside the second interlayer insulating film 421. Some of the second metal patterns 422 may be connected with the first connection terminals 425. Others of the second metal pattern 423 may be connected to a second through via 427 to be described below. The second metal patterns 422 and 423 may include, for example, but are not limited to, copper (Cu).

A plurality of second through vias 427 may each penetrate or extend in the second silicon substrate 426. The plurality of second through vias 427 may penetrate or extend from the front side 426*a* to the rear side 426*b* of the second silicon substrate 426. At least some of each second through via 427 may protrude or extend from the rear side 426*b* of the second silicon substrate 426. That is, the level of the upper side of each second through via 427 may be different from the level of the rear side 426*b* of the second silicon substrate 426. For example, the plurality of second through vias 427 may each extend above the rear side 426*b* of the second silicon substrate 426 in the third direction Z. The plurality of second through vias 427 may electrically connect the second metal patterns 422 and 423 and the second chip pads 424. That is, the first die 410, the second die 420 and the third die 430 may be electrically connected through the plurality of second through vias 427. The plurality of second through vias 427 may each include, but are not limited to, a metal material such as copper (Cu) or aluminum (Al).

The second insulating film 428 may extend along the rear side 426*b* of the second silicon substrate 426. The second insulating film 428 may include an insulating material such as silicon oxide film or silicon nitride film. The upper side of the second insulating film 428 may be placed in the same plane as (e.g., may be coplanar with) the upper sides of the plurality of second through vias 427.

A plurality of second chip pads 424 may be placed on the rear side 426*b* of the second silicon substrate 426. The plurality of second chip pads 424 may be electrically connected to the plurality of second through vias 427, respectively. Furthermore, the plurality of second chip pads 424 may be electrically connected to the plurality of second connection terminals 435. The plurality of second chip pads 424 may come into contact with the plurality of second connection terminals 435.

The second dummy pattern 429 may have the same shape as the first dummy pattern 419. Although not shown, the second dummy pattern 429 may have a grid shape from a plan viewpoint. The first dummy pattern 419 may wrap each of the plurality of first chip pads 414 from a plan viewpoint. However, the technical idea of the present disclosure is not limited thereto.

The second dummy pattern 429 may include a metal film or a polymer film. For example, the second dummy pattern 429 may include a metal film such as copper (Cu) or nickel (Ni), or may include a polymer film such as polyimide (PSPI).

Since the second die 420 includes the second dummy pattern 429, warpage of the second die 420 may decrease. A plurality of second metal patterns 422 and 423 including a metal material may be formed below the second silicon substrate 426 (e.g., formed on the front side 426*a* of the second silicon substrate 426). On the other hand, in the upper portion of the second silicon substrate 426, the configurations having the metal material may be relatively small. When the second die 420 has the aforementioned structure, warpage of the second die 420 may deepen. The present disclosure may reduce warpage of the second die 420 by placing the second dummy pattern 429 above the second silicon substrate 426 (e.g., by placing the second dummy pattern 429 on the rear side 426*b* of the second silicon substrate 426).

Various embodiments of the semiconductor package of the present disclosure will now be described with reference to FIGS. 6A to 16.

FIGS. 6A, 6B, 7A, 7B, 8, 9, and 10 are example diagrams for describing a semiconductor package according to some embodiments.

Figure 6A:
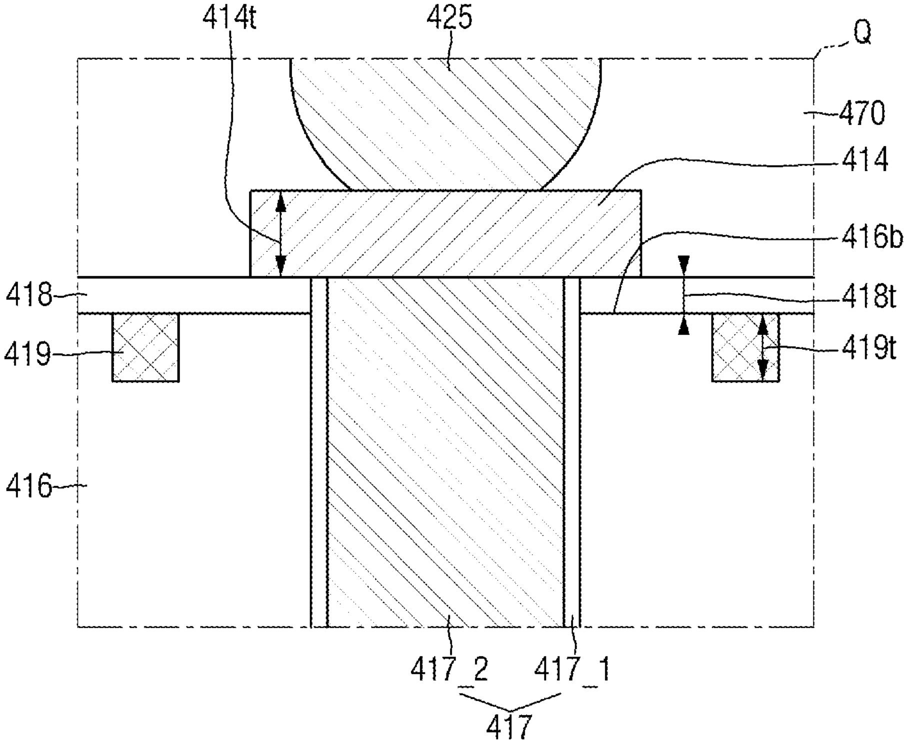
FIGS. 6A, 6B, 7A, 7B, 8, 9, and 10 are example diagrams for describing a semiconductor package according to some embodiments.
Figure 6B:
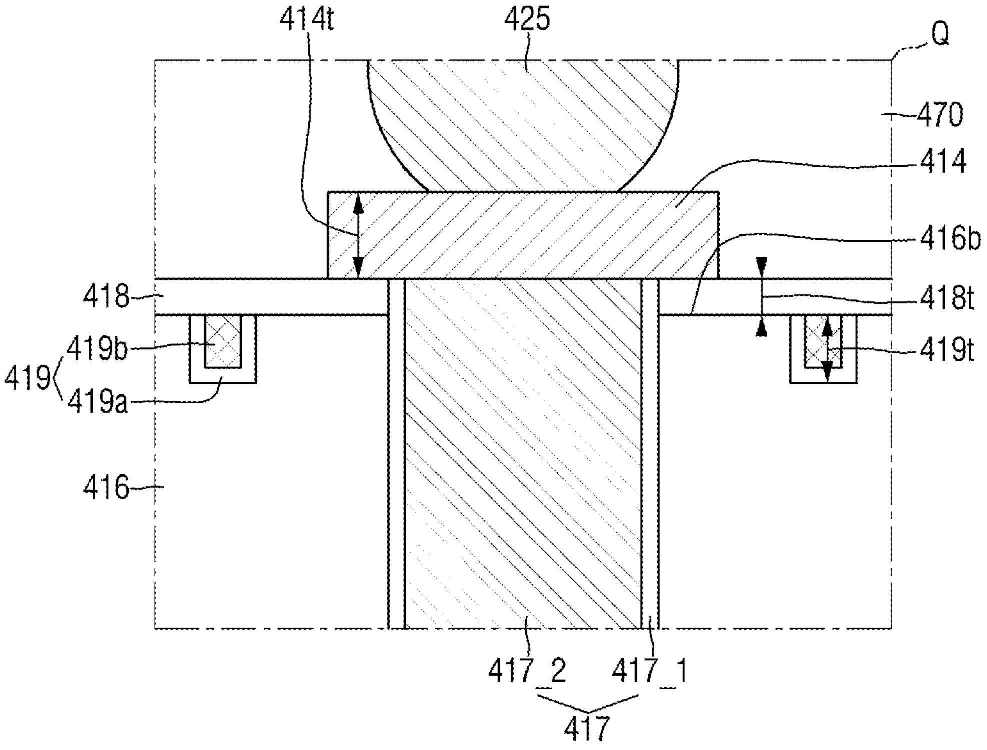

First, referring to FIGS. 6A and 6B, a first dummy pattern 419 according to some embodiments may be placed in the first silicon substrate 416. The first dummy pattern 419 may be placed on the lower side of the first insulating film 418. The upper side of the first dummy pattern 419 may come into contact with the rear side 416*b* of the first silicon substrate 416.

In some embodiments, a part or a portion of the first silicon substrate 416 may be etched to form a recess prior to forming the first insulating film 418. The first dummy pattern 419 may be formed inside the recess. The first insulating film 418 may then be formed. In this case, the first dummy pattern 419 may not overlap the first insulating film 418 in the horizontal direction (e.g., the first direction X, or the second direction Y).

In FIG. 6B, the first dummy pattern 419 may be a double film. For example, the first dummy pattern 419 may include a first portion 419*a* and a second portion 419*b*. The first portion 419*a* of the first dummy pattern 419 may be made up of an oxide film, a nitride film, a carbide film, a polymer or a combination thereof. The second portion 419*b* of the first dummy pattern 419 may include a metal material such as copper (Cu) or nickel (Ni), or a polymeric material such as polyimide (PSPI).

Figure 7A:
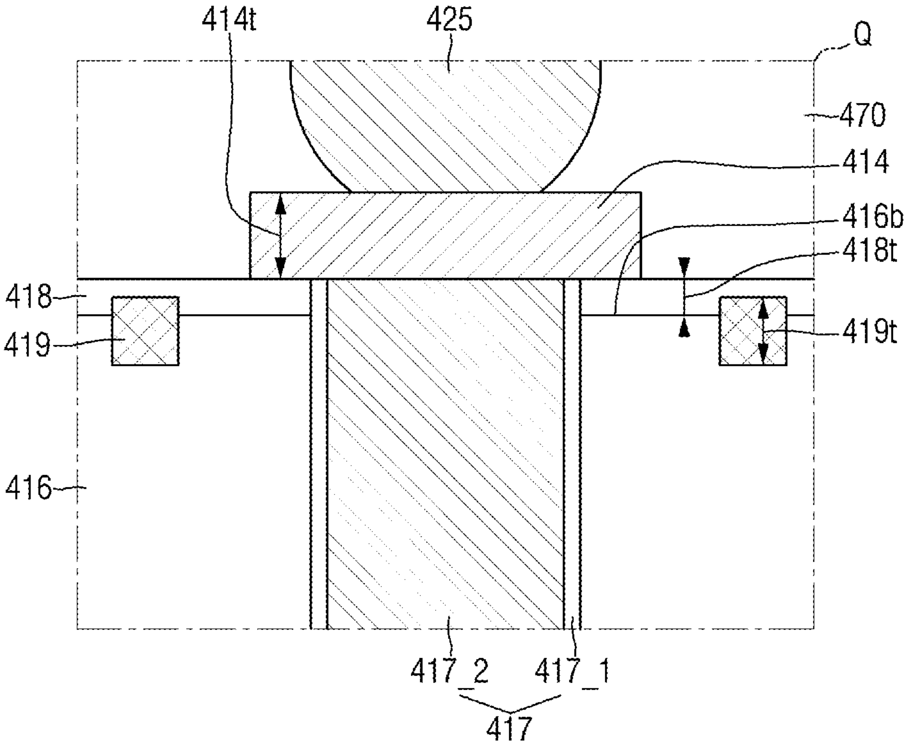
Figure 7B:
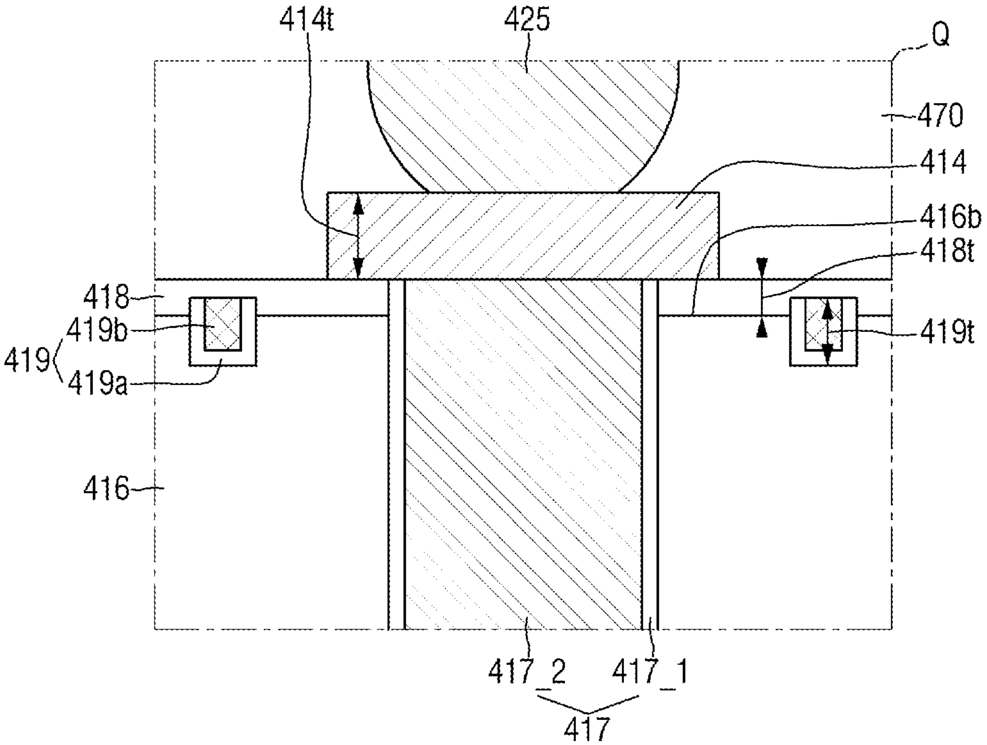

Referring to FIGS. 7A and 7B, a part or a portion of the first dummy pattern 419 may be placed in the first silicon substrate 416. Another part or portion of the first dummy pattern 419 may be placed inside the first insulating film 418. The first dummy pattern 419 may not be placed on the upper side of the first insulating film 418.

Prior to forming the first insulating film 418, a part or a portion of the first silicon substrate 416 may be etched to form a recess. The first dummy pattern 419 may be formed in the recess. A part or a portion of the dummy pattern 419 may protrude or extend above the rear side 416*b* of the first silicon substrate 416. Subsequently, the first insulating film 418 may be formed. The first insulating film 418 may cover or be on the first dummy pattern 419.

A part or a portion of the first dummy pattern 419 may overlap the first silicon substrate 416 in the first direction X or the second direction Y. A part or a portion of the first dummy pattern 419 may overlap the first insulating film 418 in the first direction X or the second direction Y.

In FIG. 7B, the first dummy pattern 419 may be a double film. For example, the first dummy pattern 419 may include a first portion 419*a* and a second portion 419*b*. The first portion 419*a* of the first dummy pattern 419 may be made up of an oxide film, a nitride film, a carbide film, a polymer or a combination thereof. The second portion 419*b* of the first dummy pattern 419 may include a metal material such as copper (Cu) or nickel (Ni), or a polymeric material such as polyimide (PSPI).

Figure 8:
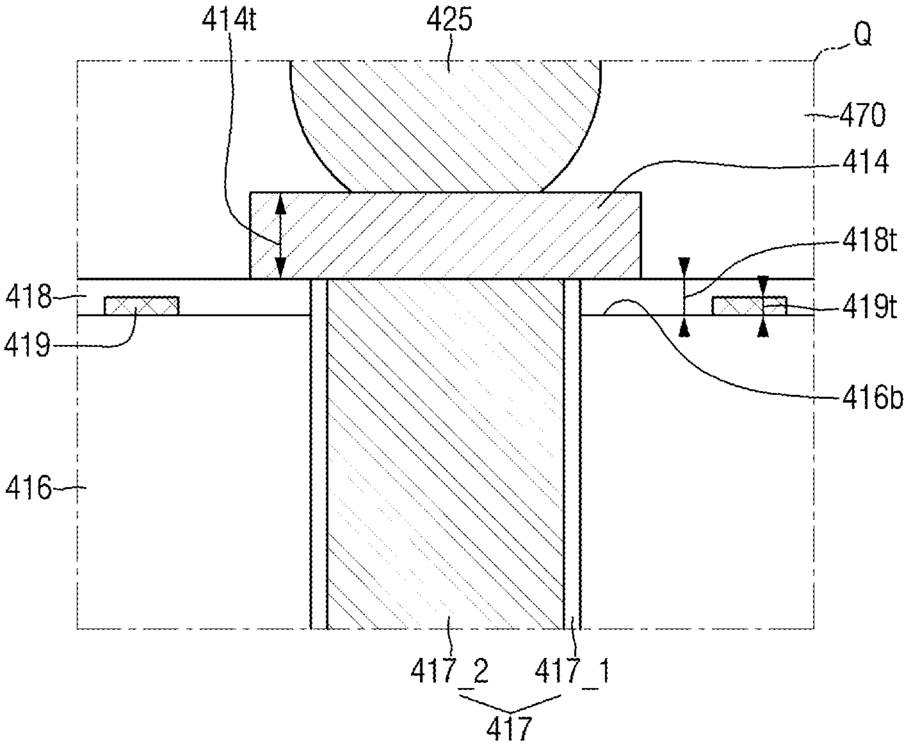

Referring to FIG. 8, the first dummy pattern 419 may be placed inside the first insulating film 418. A lower side of the first dummy pattern 419 may come into contact with the rear side 416*b* of the first silicon substrate 416.

The first dummy pattern 419 may be formed on the rear side 416*b* of the first silicon substrate 416 before forming the first insulating film 418. Subsequently, the first insulating film 418 may be formed to cover or be on the first dummy pattern 419. The first dummy pattern 419 may completely overlap the first insulating film 418 in the first direction X or the second direction Y. In some embodiments, a thickness 418*t* of the first insulating film 418 in the third direction Z may be greater than a thickness 419*t* of the first dummy pattern 419 in the third direction Z.

Figure 9:
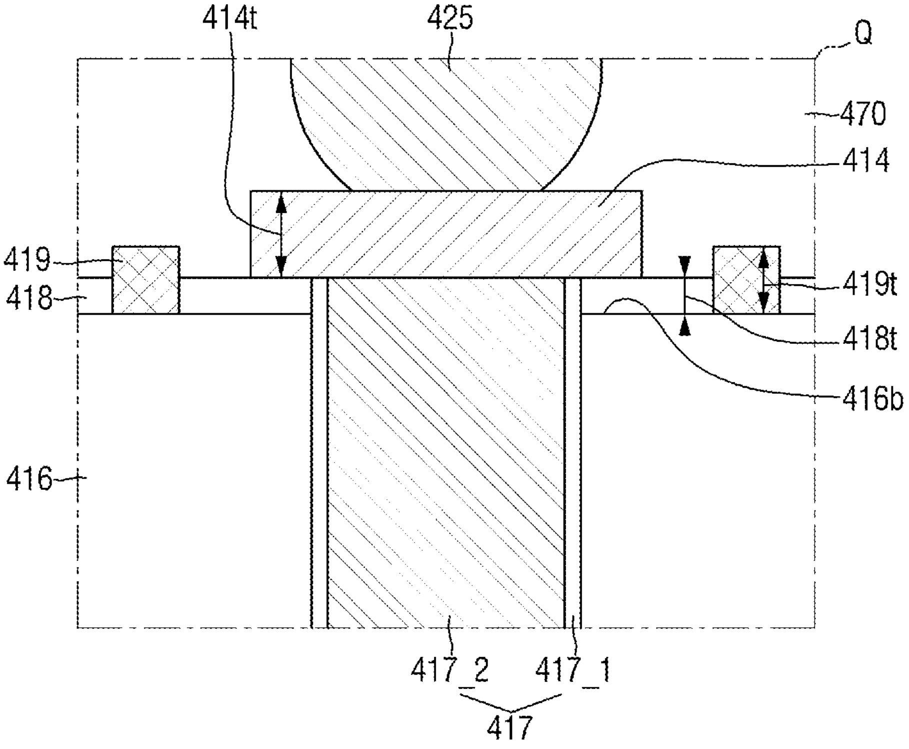

Referring to FIG. 9, before forming the first insulating film 418, the first dummy pattern 419 may be formed on the rear side 416*b* of the first silicon substrate 416. A lower side of the first dummy pattern 419 may come into contact with the rear side 416*b* of the first silicon substrate 416.

Subsequently, the first insulating film 418 may be formed. The first insulating film 418 may not completely cover the first dummy pattern 419. That is, although the first insulating film 418 may completely overlap the first dummy pattern 419 in the first direction X or the second direction Y, a part or a portion of the first dummy pattern 419 may not overlap the first insulating film 418 in the first direction X or the second direction Y. The thickness 418*t* of the first insulating film 418 in the third direction Z may be smaller than the thickness 419*t* of the first dummy pattern 419 in the third direction Z.

Figure 10:
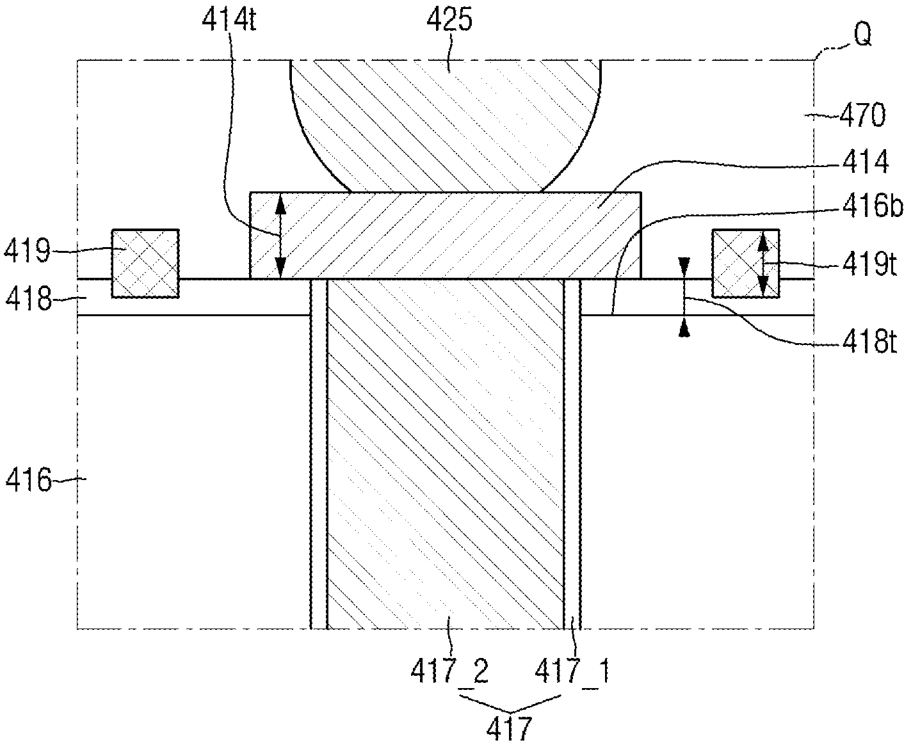

Referring to FIG. 10, at least a part or a portion of the first dummy pattern 419 may be placed inside the first insulating film 418.

First, the first insulating film 418 may be formed on the rear side 416*b* of the first silicon substrate 416. Subsequently, the first dummy pattern 419 may be formed. A part or a portion of the first dummy pattern 419 may overlap the first insulating film 418 in the first direction X or the second direction Y. Another part or portion of the first dummy pattern 419 may not overlap the first insulating film 418 in the first direction X or the second direction Y.

The lower side of the first dummy pattern 419 may not be placed in the same plane as (e.g., may not be coplanar with) the lower side of the first insulating film 418. That is, a part or a portion of the first insulating film 418 may not overlap the first dummy pattern 419 in the first direction X or the second direction Y.

Figure 11:
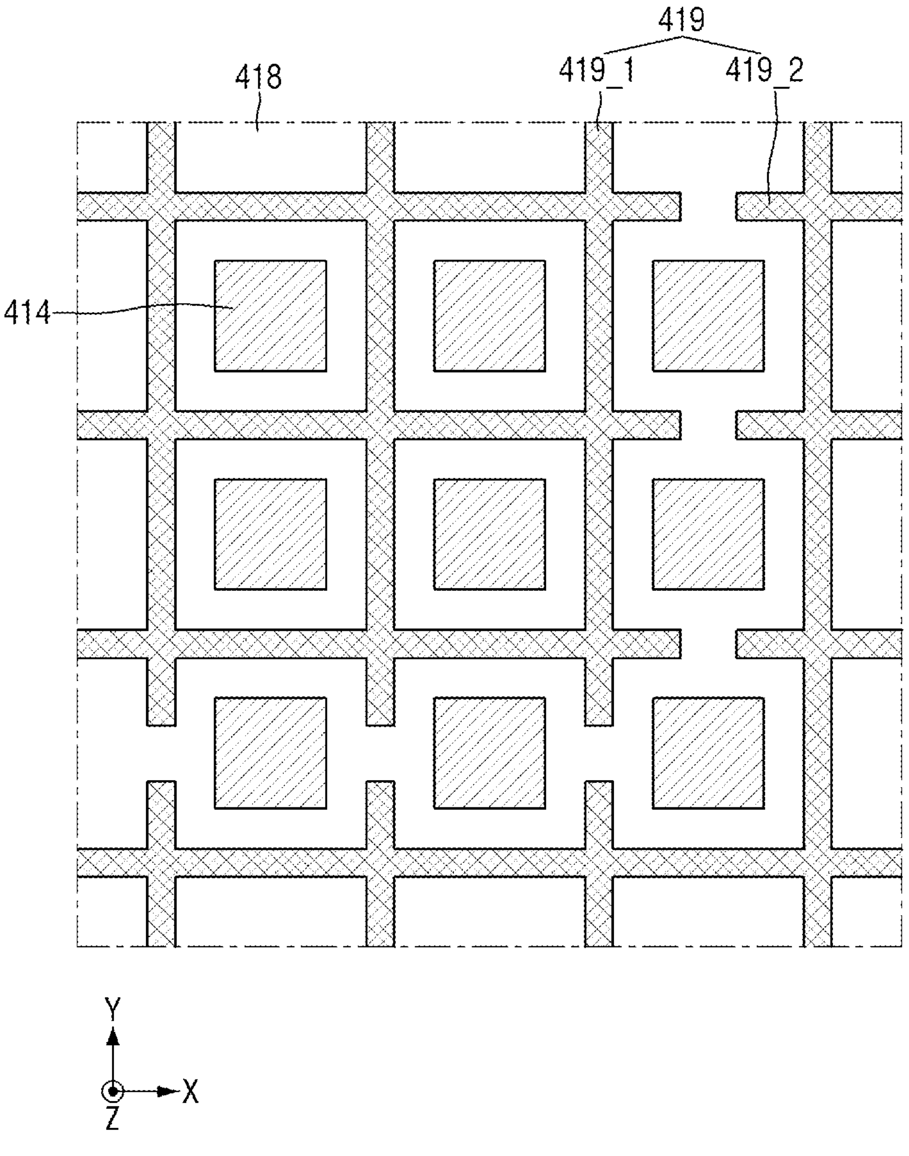
FIGS. 11 and 12 are example diagrams for describing a semiconductor package according to some embodiments.
Figure 12:
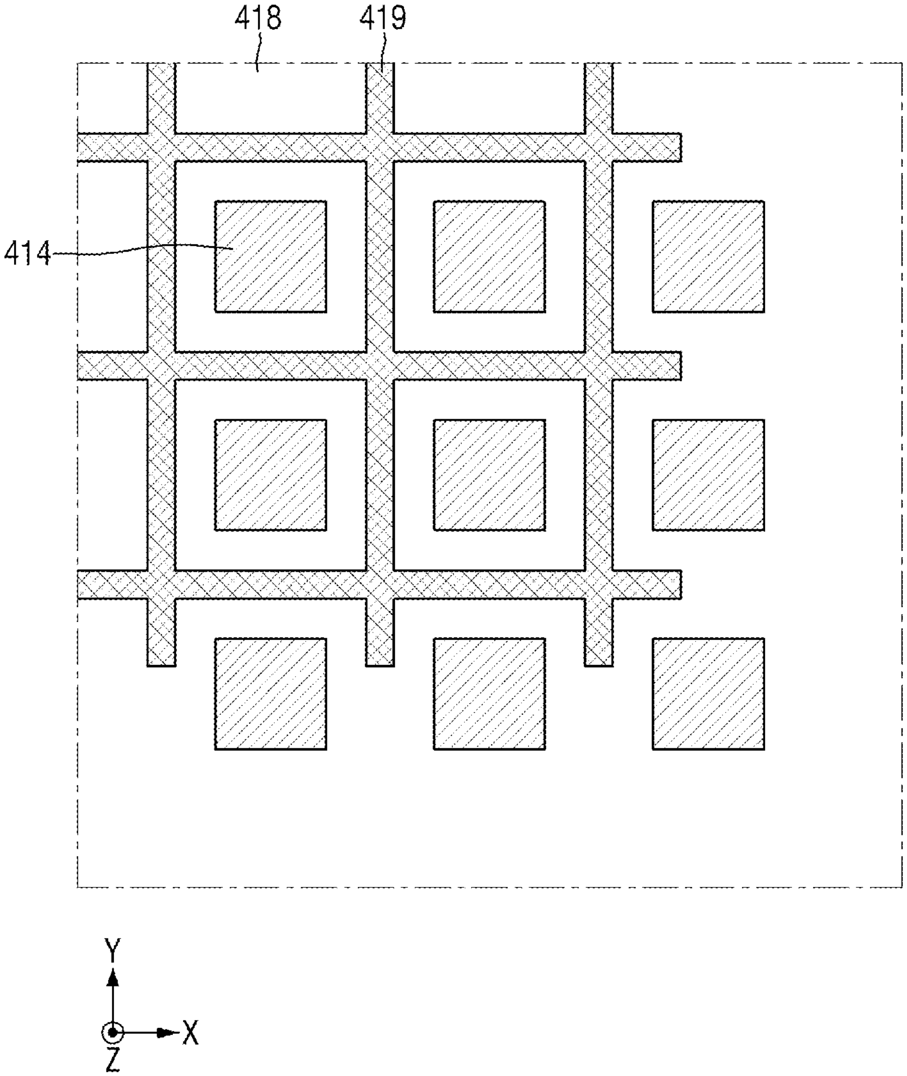

FIGS. 11 and 12 are example diagrams for describing a semiconductor package according to some embodiments.

Referring to FIG. 11, the first dummy pattern 419 may include a first sub-pattern 419_1 and a second sub-pattern 419_2 from a plan viewpoint. The first sub-pattern 419_1 and the second sub-pattern 419_2 may not be connected to each other.

More specifically, the first dummy pattern 419 may include a plurality of sub-patterns having a grid shape from the plan viewpoint. Each sub-pattern may not be connected to each other. For example, the first sub-pattern 419_1 may wrap around the four first chip pads 414. The second sub-pattern 419_2 may wrap around the remaining first chip pads 414.

Referring to FIG. 12, the first dummy patterns 419 may surround some of the plurality of first chip pads 414.

In some embodiments, a region in which the first dummy pattern 419 is formed, and a region in which the first dummy pattern 419 is not formed may be included from the plan viewpoint. That is, the first dummy pattern 419 may be selectively formed in some regions.

Figure 13:
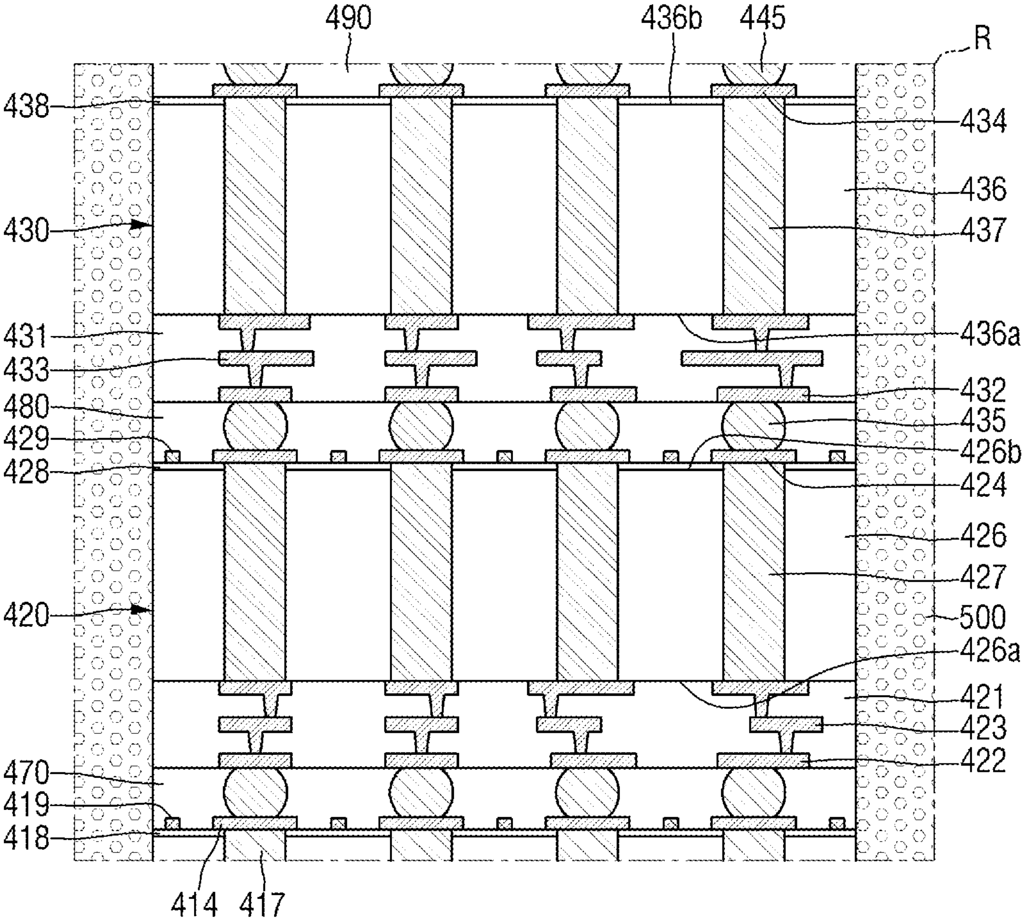
FIG. 13 is an example diagram for describing a semiconductor package according to some embodiments.

FIG. 13 is an example diagram for describing a semiconductor package according to some embodiments. For reference, FIG. 13 may be an enlarged view of the region R of FIG. 2.

Referring to FIGS. 2 and 13, the second semiconductor chip 400 may include a lower die structure and an upper die structure. The upper die structure may be placed on the lower die structure. As an example, although the first and second dies 410 and 420 may constitute a lower die structure, and the third and fourth dies 430 and 440 may constitute an upper die structure, the embodiments are not limited thereto. In some embodiments, one or more dies in the lower die structure (e.g., the first and second dies 410 and 420) may include the dummy pattern, and one or more dies in the upper die structure (e.g., the third and fourth dies 430 and 440) may not include the dummy pattern.

In FIG. 13, the third die 430 may include a third interlayer insulating film 431, a third silicon substrate 436, a plurality of third through vias 437, a third insulating film 438 and a plurality of third chip pads 434. The third die 430 may not include dummy patterns.

The third silicon substrate 436 may include a front side 436*a* and a rear side 436*b* opposite to the front side 436*a*. For example, the front side 436*a* and the rear side 436*b* may be opposite to each other. As used herein, the front side 436*a* of the third silicon substrate 436 may also be referred to as a lower side 436*a*, and the rear side 436*b* of the third silicon substrate 436 may also be referred to as an upper side 436*b*. The front side 436*a* of the third silicon substrate 436 may face the second die 420. The rear side 436*b* of the third silicon substrate 436 may face the fourth die 440. The third silicon substrate 436 may include silicon (Si).

The third interlayer insulating film 431 may be placed on the front side 436*a* of the third silicon substrate 436. The third interlayer insulating film 431 may be placed between the third silicon substrate 436 and the second die 420. Each of the third interlayer insulating films 431 may be made up of a photoimageable dielectric. For example, the third interlayer insulating film 431 may include a photoimageable polymer. The photoimageable polymer may be formed of, for example, at least one of photoimageable polyimide, polybenzoxazole, phenolic polymer, and/or benzocyclobutene-based polymer. As another example, the third interlayer insulating film 431 may be formed of a silicon oxide film, a silicon nitride film or a silicon oxynitride film.

The third metal patterns 432 and 433 may be included inside the third interlayer insulating film 431. Some of the third metal patterns 432 may be connected to the second connection terminal 435. Others of the third metal pattern 433 may be connected to a third through via 437, which will be described below. The third metal patterns 432 and 433 may include, for example, but are not limited to, copper (Cu).

A plurality of third through vias 437 may each penetrate or extend in the third silicon substrate 436. The plurality of third through vias 437 may penetrate or extend from the front side 436*a* to the rear side 436*b* of the third silicon substrate 436. At least a part or a portion of each third through via 437 may protrude or extend from the rear side 436*b* of the third silicon substrate 436. That is, the level of the upper side of each third through via 437 may be different from the level of the rear side 436*b* of the third silicon substrate 436. For example, the plurality of third through vias 437 may each extend above the rear side 436*b* of the third silicon substrate 436 in the third direction Z. A plurality of third through vias 437 may electrically connect the third metal patterns 432 and 433 and the third chip pads 434. That is, the first die 410, the second die 420, the third die 430 and the fourth die 440 may be electrically connected through the plurality of third through vias 437. The plurality of third through vias 437 may each include, but are not limited to, a metal material such as copper (Cu) or aluminum (Al).

The third insulating film 438 may extend along the rear side 436*b* of the third silicon substrate 436. The third insulating film 438 may include an insulating material such as a silicon oxide film or a silicon nitride film. The upper side of the third insulating film 438 may be placed on the same plane as (e.g., may be coplanar with) the upper sides of the plurality of third through vias 437.

A plurality of third chip pads 434 may be placed on the rear side 436*b* of the third silicon substrate 436. The plurality of third chip pads 434 may be electrically connected to the plurality of third through vias 437, respectively. Also, the plurality of third chip pads 434 may be electrically connected to the plurality of third connection terminals 445.

In some embodiments, the third die 430 may not include a dummy pattern. That is, the dummy pattern may be selectively formed. However, the technical idea of the present disclosure is not limited thereto. The third die 430 may not include the dummy pattern, and the fourth die 440 may include the dummy pattern.

Figure 14:
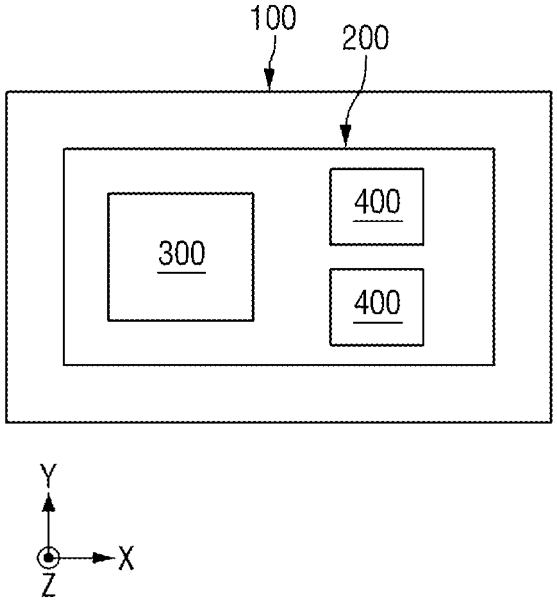
FIGS. 14 to 16 are example plan views showing a semiconductor package according to some embodiments.
Figure 15:
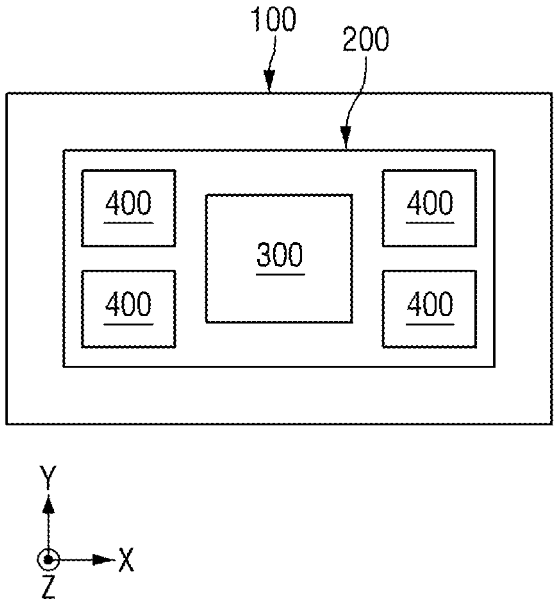
Figure 16:
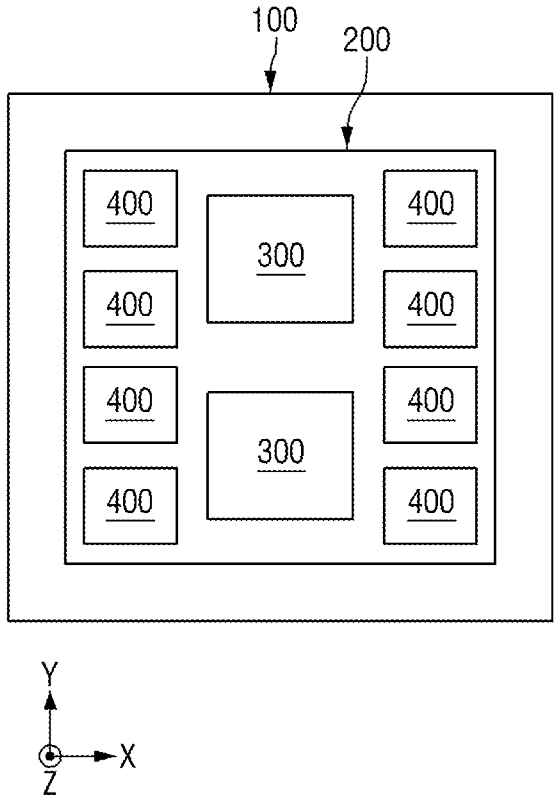

FIGS. 14 to 16 are example plan views showing a semiconductor package according to some embodiments.

First, referring to FIG. 14, the semiconductor package according to some embodiments may include one first semiconductor chip 300 and two second semiconductor chips 400. In some embodiments, the first semiconductor chip 300 may be a logic chip, and the second semiconductor chip 400 may be a memory chip. That is, in some embodiments, one logic chip and a plurality of memory chips may be implemented on the single interposer structure 200.

The first semiconductor chip 300 may be spaced apart from the second semiconductor chips 400 in the first direction X. The second semiconductor chips 400 may be spaced apart from each other in the second direction Y. In some embodiments, a ratio of the first semiconductor chip 300 and the second semiconductor chips 400 may be, but is not limited to, 1:2.

Referring to FIG. 15, the semiconductor package according to some embodiments may include one first semiconductor chip 300 and four second semiconductor chips 400. That is, one logic chip and four memory chips may be mounted on the single interposer structure 200.

The first semiconductor chip 300 may be provided between the second semiconductor chips 400. The second semiconductor chips 400 may be provided around the first semiconductor chip 300. From a plan viewpoint, the second semiconductor chip 400 may have a structure that wraps the first semiconductor chip 300.

The first semiconductor chip 300 may be spaced from the second semiconductor chips 400 in the first direction X. The second semiconductor chips 400 may be spaced apart from each other in the second direction Y. In some embodiments, the ratio of the first semiconductor chip 300 and the second semiconductor chips 400 may be, but is not limited to, 1:4.

Referring to FIG. 16, the semiconductor package according to some embodiments may include two first semiconductor chips 300 and eight second semiconductor chips 400. That is, two logic chips and eight memory chips may be mounted on the single interposer structure 200.

The first semiconductor chips 300 may be spaced apart from each other in the second direction Y. The second semiconductor chips 400 may be aligned with each other in the second direction Y. The second semiconductor chips 400 may be spaced apart from each other in the first direction X and the second direction Y. The first semiconductor chips 300 may be provided between the second semiconductor chips 400. In some embodiments, the ratio of first semiconductor chips 300 to second semiconductor chips 400 may be, but is not limited to, 2:8.

A method for fabricating a semiconductor package according to some embodiments will be described below with reference to FIGS. 17 to 24.

FIGS. 17 to 24 are intermediate stage diagrams for describing the method for fabricating the semiconductor package according to some embodiments.

Figure 17:
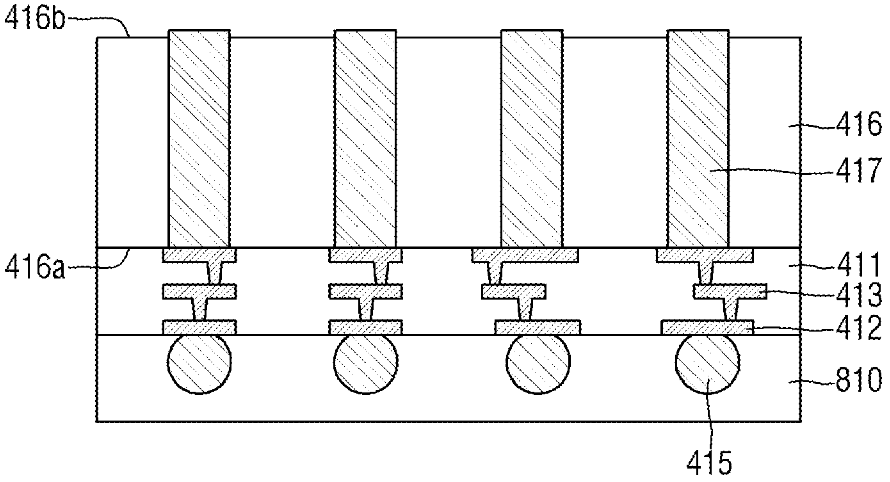
FIGS. 17 to 24 are intermediate stage diagrams for describing a method for fabricating the semiconductor package according to some embodiments.

First, referring to FIG. 17, a first carrier substrate 810 may be provided. The first carrier substrate 810 may include a glass. A fourth connecting member 415 may be placed inside the first carrier substrate 810. The first carrier substrate 810 may protect the fourth connecting member 415.

A first interlayer insulating film 411 may be formed on the first carrier substrate 810. Second pads 412 and first metal patterns 413 may be formed inside the first interlayer insulating film 411. A first silicon substrate 416 may be formed on the first interlayer insulating film 411. The first silicon substrate 416 may include a front side **416*a* and a rear side 416*b* that are opposite to each other. The front side 416*a* of the first silicon substrate 416 may face the first interlayer insulating film 411**.

A plurality of first through vias 417 may be formed inside the first silicon substrate 416. The plurality of first through vias 417 may penetrate or extend in the first silicon substrate 416. Each of the plurality of first through vias 417 may penetrate or extend in the first silicon substrate 416 and be connected to some of the first metal patterns 413. An upper side of each first through via 417 may protrude or extend from the rear side **416*b* of the first silicon substrate 416. For example, the plurality of first through vias 417 may each extend above the rear side 416*b* of the first silicon substrate 416** in the third direction Z.

Figure 18:
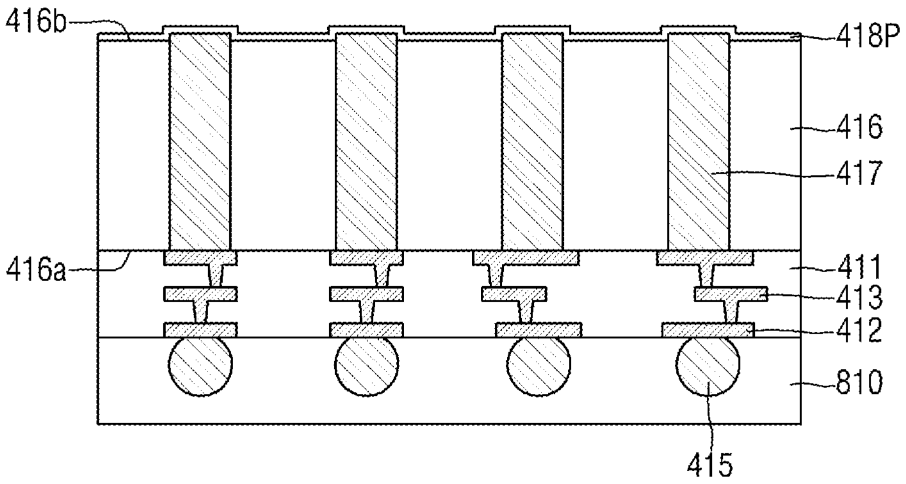

Referring to FIG. 18, a pre-first insulating film 418P may be formed along the rear side **416*b* of the first silicon substrate 416 and the upper sides of each first through via 417. The pre-first insulating film 418P may be formed conformally, but is not limited thereto. The pre-first insulating film 418**P may include an insulating material such as a silicon oxide film or a silicon nitride film.

Figure 19:
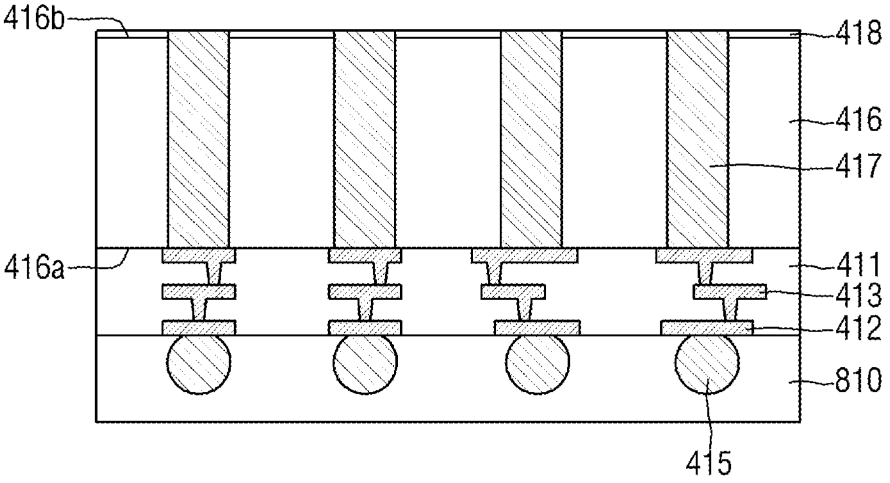

Referring to FIG. 19, the first insulating film 418 may be formed by removing a part or a portion of the pre-first insulating film 418P. The first insulating film 418 may expose the upper sides of each first through via 417. The upper side of the first insulating film 418 may be placed in the same plane as (e.g., may be coplanar with) the upper sides of each first through via 417.

Figure 20:
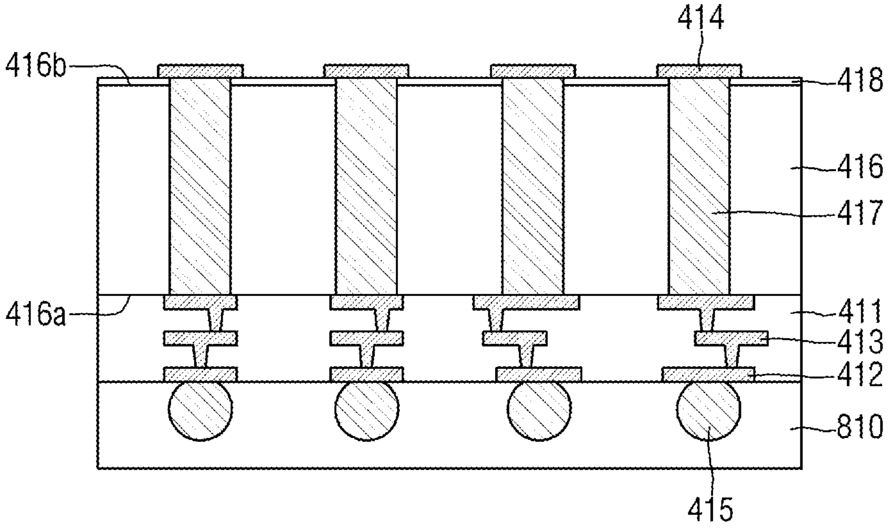

Referring to FIG. 20, a plurality of first chip pads 414 may be formed. Each of the plurality of first chip pads 414 may be placed on the first insulating film 418 and connected to the plurality of first through vias 417.

Figure 21:
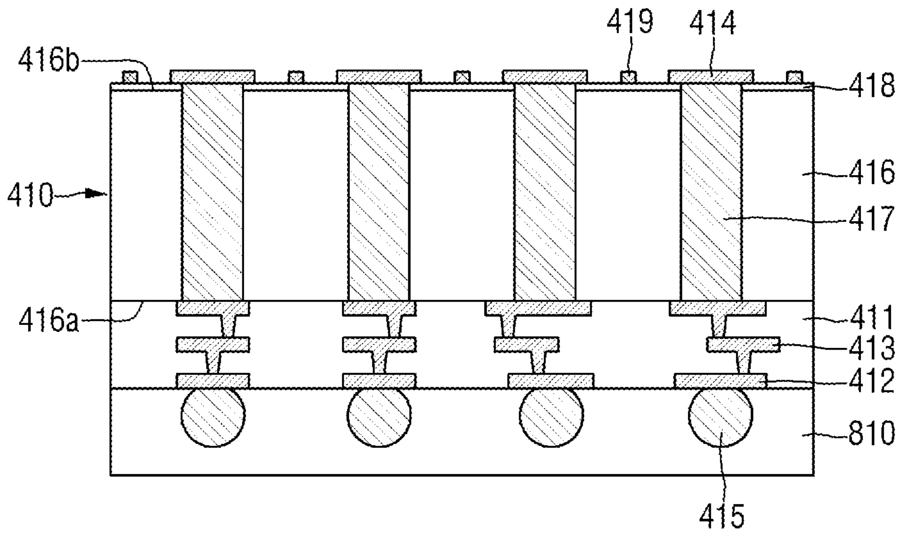

Referring to FIG. 21, a first die 410 may be formed.

Specifically, a first dummy pattern 419 may be formed on the first insulating film 418. The first dummy pattern 419 may have a grid shape from the plan viewpoint. The first dummy pattern 419 may be formed between the plurality of first chip pads 414 from the cross-sectional viewpoint. In some embodiments, the first dummy pattern 419 may include a metal film or a polymer film. For example, the first dummy pattern 419 may include a metal film such as copper (Cu) or nickel (Ni), or may include a polymer layer such as photosensitive polyimide (PSPI). Since the first dummy pattern 419 is included, warpage of the first die 410 may be reduced.

Figure 22:
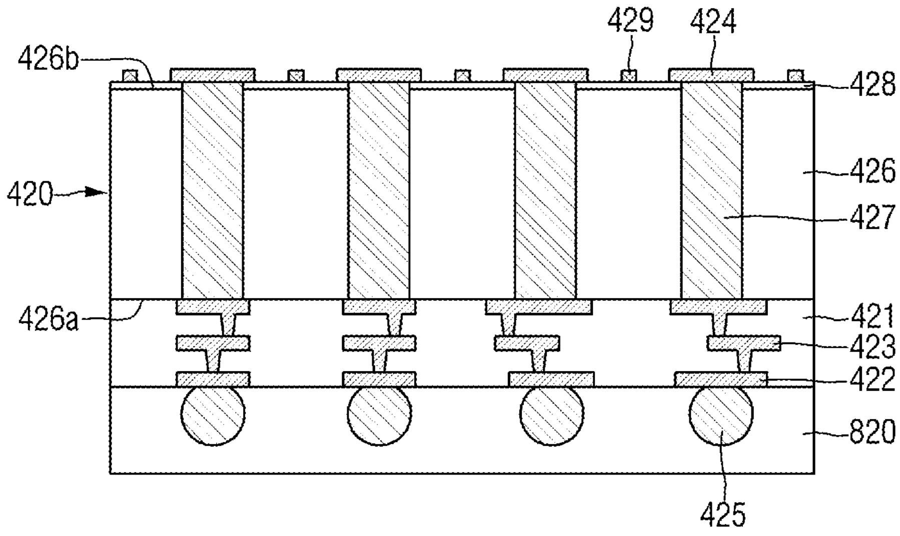

Referring to FIG. 22, a second die 420 may be fabricated in a manner similar to that described with reference to FIGS. 17 to 21. A second carrier substrate 820 may be provided. A description of the second carrier substrate 820 may be the same as the description of the first carrier substrate 810, and is therefore omitted.

A first connection terminal 425 may be placed inside the second carrier substrate 820. The second carrier substrate 820 may protect the first connection terminal 425. A second die 420 may be formed on the second carrier substrate 820. The second die 420 may include a second interlayer insulating film 421, second metal patterns 422 and 423, a second silicon substrate 426, a plurality of second through vias 427, a second insulating film 428, a plurality of second chip pads 424, a second dummy pattern 429, and a first connection terminal 425. As with the first die 410, since the second dummy pattern 429 is included, warpage of the second die 420 may be reduced. As with the first dummy pattern 419, the second dummy pattern 429 may have a grid shape from the plan viewpoint.

Figure 23:
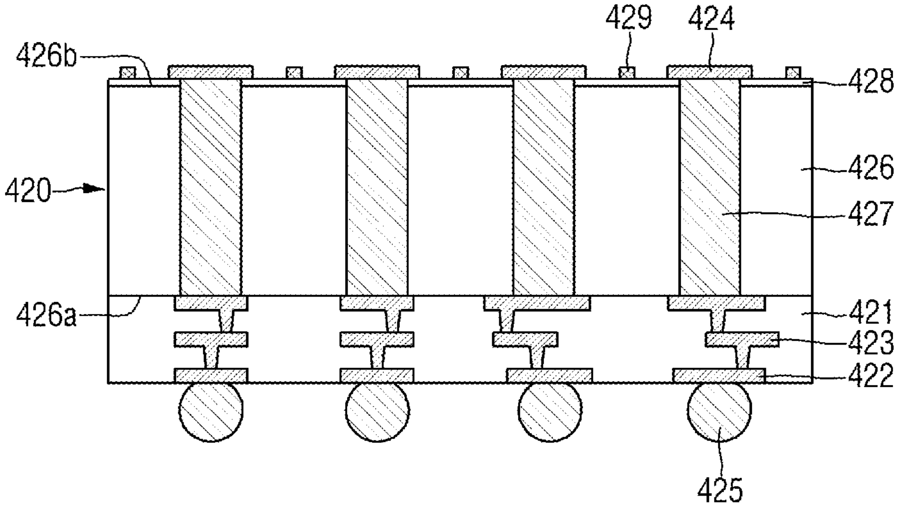

Referring to FIG. 23, the second carrier substrate 820 may be removed to expose the first connection terminal 425.

Figure 24:
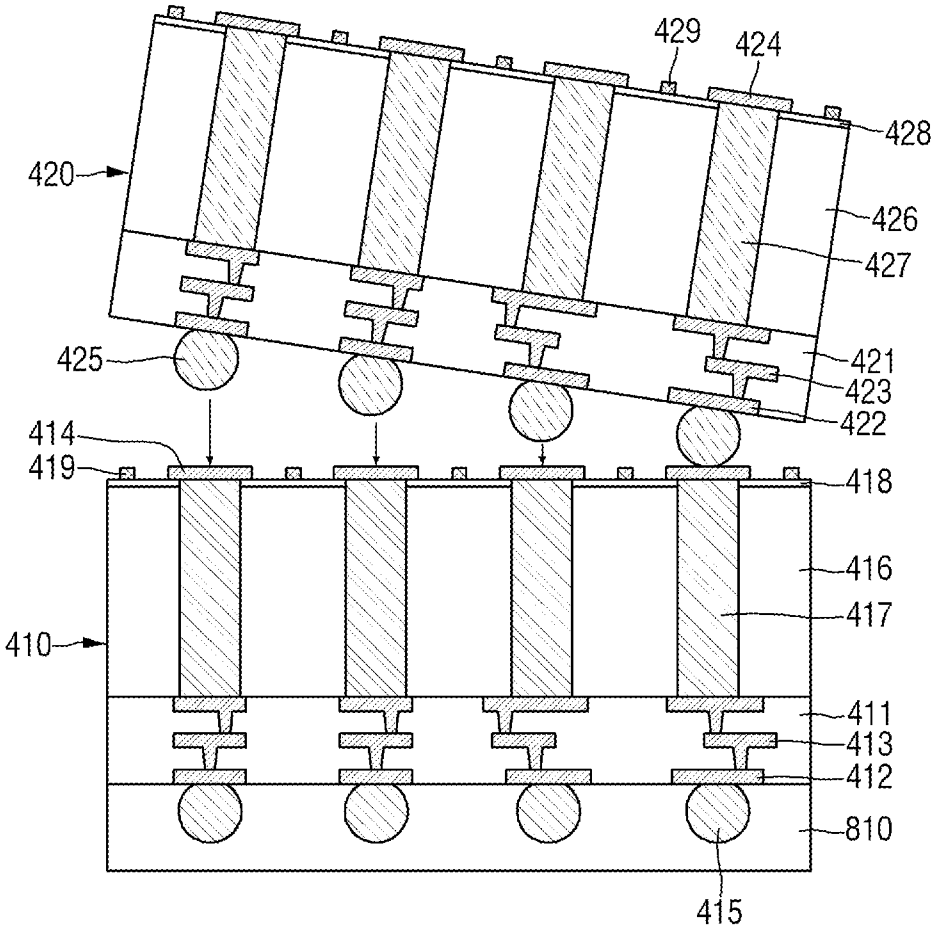

Referring to FIG. 24, the first die 410 and the second die 420 may be connected. For example, the first connection terminal 425 may be attached to some of the second metal patterns 422. The first die 410 and the second die 420 may be electrically connected through the first connection terminals 425.

The first connection terminals 425 may be connected to the first chip pads 414. Since the first die 410 includes the first dummy pattern 419, warpage may be controlled. Similarly, since the second die 420 includes the second dummy pattern 429, the warpage may be controlled. Therefore, it may be easy to connect the first connection terminal 425 and the first chip pad 414. Accordingly, a semiconductor package with improved reliability can be fabricated.

As used herein, the words "include/comprise", "contain", "have", and any other variations specify the presence of the stated features, steps, operations, elements, and/or components, but do not preclude the presence or addition of one or more other features, steps, operations, elements, components, and/or groups thereof.

In concluding the detailed description, those skilled in the art will appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. A semiconductor package comprising:

a first die;

a second die on the first die; and a plurality of connection terminals that are between the first die and the second die and are configured to electrically connect the first die to the second die, wherein the first die comprises:

a first silicon substrate that has a lower side and an upper side opposite to the lower side;

a plurality of first through vias that extend in the first silicon substrate and are electrically connected to the plurality of connection terminals, respectively;

a plurality of first chip pads that are on the upper side of the first silicon substrate and are electrically connected to the first through vias, respectively; and a first dummy pattern on the upper side of the first silicon substrate, the first dummy pattern having a grid shape from a plan view and at least partially surrounding each of the plurality of first chip pads, wherein the second die comprises:

a second silicon substrate that has a lower side and an upper side opposite to the lower side, the lower side of the second silicon substrate facing the upper side of the first silicon substrate; and a plurality of second through vias that extend in the second silicon substrate, wherein the plurality of connection terminals and the plurality of first chip pads are in contact with each other and are electrically connected, respectively, wherein the first dummy pattern includes a metal film or a polymer film, and wherein at least a portion of the first dummy pattern is in the first silicon substrate.

2. The semiconductor package of claim 1, wherein at least a portion of the first dummy pattern is in contact with the upper side of the first silicon substrate.

3. The semiconductor package of claim 1, wherein the first die further comprises a first insulating film that extends along the upper side of the first silicon substrate.

4. The semiconductor package of claim 3, wherein at least a portion of the first dummy pattern is in the first insulating film.

5. The semiconductor package of claim 3, wherein at least a portion of the first dummy pattern is on the first insulating film.

6. The semiconductor package of claim 3, wherein a thickness of the first dummy pattern in a vertical direction is greater than a thickness of the first insulating film in the vertical direction.

7. The semiconductor package of claim 1, wherein the first dummy pattern includes a first sub-pattern and a second sub-pattern, and the first sub-pattern and the second sub-pattern are not connected to each other.

8. The semiconductor package of claim 1, wherein the second die further comprises:

a plurality of second chip pads that are on the upper side of the second silicon substrate and are electrically connected to the second through vias, respectively, and a second dummy pattern on the upper side of the second silicon substrate, the second dummy pattern having a grid shape from the plan view and at least partially surrounding each of the plurality of second chip pads.

9. The semiconductor package of claim 8, wherein the second dummy pattern includes a metal film or a polymer film.

10. The semiconductor package of claim 1, wherein a thickness of at least one of the first chip pads in a vertical direction is greater than a thickness of the first dummy pattern in the vertical direction.

11. A semiconductor package comprising:

a package substrate;

an interposer structure on the package substrate; and first and second semiconductor chips on the interposer structure and spaced apart from each other in a first direction, wherein the second semiconductor chip includes a plurality of dies stacked in a second direction intersecting the first direction, and a plurality of connection terminals that are configured to electrically connect the plurality of dies to each other, wherein each of the plurality of dies comprises:

a silicon substrate that has a lower side and an upper side opposite to the lower side, the lower side of the silicon substrate facing the interposer structure;

a plurality of through vias that extend in the silicon substrate and are electrically connected to the plurality of connection terminals, respectively;

a plurality of chip pads that are on the upper side of the silicon substrate and are electrically connected to the through vias, respectively; and an insulating film that extends along the upper side of the silicon substrate, wherein at least one of the plurality of dies includes a dummy pattern on the insulating film, the dummy pattern having a grid shape from a plan view and at least partially surrounding each of the plurality of chip pads of the at least one of the plurality of dies, and wherein at least a portion of the dummy pattern is in the silicon substrate.

12. The semiconductor package of claim 11, wherein the dummy pattern includes a first sub-pattern and a second sub-pattern, and the first sub-pattern and the second sub-pattern are not connected to each other.

13. The semiconductor package of claim 11, wherein the dummy pattern includes a metal film or a polymer film.

14. The semiconductor package of claim 11, wherein a thickness of the dummy pattern in the second direction is greater than a thickness of the insulating film in the second direction.

15. The semiconductor package of claim 11, wherein a thickness of at least one of the chip pads in the second direction is greater than a thickness of the dummy pattern in the second direction.

16. The semiconductor package of claim 11, wherein the second semiconductor chip comprises a lower die structure that includes at least one of the plurality of dies, and an upper die structure that includes at least one of the plurality of dies, the upper die structure is on the lower die structure, the at least one of the plurality of dies included in the lower die structure has the dummy pattern, and the at least one of the plurality of dies included in the upper die structure does not have the dummy pattern.

17. A semiconductor package comprising:

a package substrate;

an interposer structure on the package substrate; and a logic chip and a memory chip on the interposer structure and spaced apart from each other in a first direction, wherein the memory chip includes first and second dies stacked in a second direction intersecting the first direction, and a plurality of connection terminals that are configured to electrically connect the first die to the second die, wherein the first die comprises:

a first silicon substrate that has a lower side and an upper side opposite to the lower side, the lower side of the first silicon substrate facing the interposer structure;

a plurality of first through vias that extend in the first silicon substrate;

a plurality of first chip pads that are on the upper side of the first silicon substrate and are electrically connected to the first through vias, respectively;

a first insulating film that extends along the upper side of the first silicon substrate; and a first dummy pattern on the first insulating film, the first dummy pattern having a grid shape from a plan view and at least partially surrounding each of the plurality of first chip pads, wherein the second die comprises:

a second silicon substrate that has a lower side and an upper side opposite to the lower side, the lower side of the second silicon substrate facing the upper side of the first silicon substrate;

a plurality of second through vias that extend in the second silicon substrate;

a plurality of second chip pads that are on the upper side of the second silicon substrate and are electrically connected to the second through vias, respectively;

a second insulating film that extends along the upper side of the second silicon substrate; and a second dummy pattern on the second insulating film, the second dummy pattern having a grid shape from the plan view and at least partially surrounding each of the plurality of second chip pads, wherein the plurality of connection terminals are in contact with the plurality of first chip pads, respectively, wherein each of the first and second dummy patterns includes a metal film or a polymer film, and wherein at least a portion of the first dummy pattern is in the first insulating film.

18. The semiconductor package of claim 17, wherein the first dummy pattern includes a first sub-pattern and a second sub-pattern, and the first sub-pattern and the second sub-pattern are not connected to each other.

* * * * *